(12) United States Patent
Wang et al.

(10) Patent No.: US 12,368,412 B2
(45) Date of Patent: Jul. 22, 2025

(54) RECEIVING MODULE, PACKAGING STRUCTURE, PRINTED CIRCUIT BOARD, AND ELECTRONIC DEVICE

(71) Applicant: HONOR DEVICE CO., LTD., Shenzhen (CN)

(72) Inventors: Tong Wang, Shenzhen (CN); Qinghua Huang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/268,296

(22) PCT Filed: Jan. 4, 2023

(86) PCT No.: PCT/CN2023/070371
§ 371 (c)(1),
(2) Date: Jun. 19, 2023

(87) PCT Pub. No.: WO2023/131169
PCT Pub. Date: Jul. 13, 2023

(65) Prior Publication Data
US 2024/0223132 A1    Jul. 4, 2024

(30) Foreign Application Priority Data
Jan. 10, 2022   (CN) .................. 202210023122.7

(51) Int. Cl.
*H03F 1/26*      (2006.01)
*H03F 3/21*      (2006.01)
(Continued)

(52) U.S. Cl.
CPC .............. *H03F 1/26* (2013.01); *H03F 3/211* (2013.01); *H04B 1/16* (2013.01); *H04B 1/707* (2013.01);
(Continued)

(58) Field of Classification Search
CPC .. H04B 1/16; H04B 1/707; H03F 1/26; H03F 3/211; H03F 220/165; H03F 220/171;
(Continued)

(56) References Cited

U.S. PATENT DOCUMENTS 7,511,575 B2    3/2009   Gotou et al.
7,844,216 B2   11/2010   Cleveland et al.
(Continued)

FOREIGN PATENT DOCUMENTS

CN    101170300 A    4/2008
CN    101789922 A    7/2010
(Continued)

OTHER PUBLICATIONS

Zhang Kaixuan et al., "Overview of RF Front End Technology for GNSS Navigation Receiver", Proceedings of the 11th China Satellite Navigation Annual Conference—S09 User Terminal TechnologyZhongke Beidouhui (Beijing Technology Co., Ltd. (May 2020).
(Continued)

*Primary Examiner* — Kevin M Burd
(74) *Attorney, Agent, or Firm* — WOMBLE BOND DICKINSON (US) LLP

(57) ABSTRACT

This application provides a receiving module, a packaging structure, a printed circuit board, and an electronic device, which can mitigate a problem that application scenarios of a front-end receiving module of an existing GNSS receiver are limited. The receiving module includes a first filtering unit, an amplifying unit, and a control element. When the amplifying unit operates in a first mode, the first end of the amplifying unit acts as a signal input end, and in this way, the first filtering unit acts as a front filtering unit. When the amplifying unit operates in a second mode, the first end of
(Continued)

the amplifying unit acts as a signal output end, and in this way, the first filtering unit acts as a rear filtering unit.

17 Claims, 20 Drawing Sheets

(51) Int. Cl.
*H04B 1/16* (2006.01)
*H04B 1/707* (2011.01)

(52) U.S. Cl.
CPC .. *H03F 2200/165* (2013.01); *H03F 2200/171* (2013.01); *H03F 2200/294* (2013.01); *H03F 2200/451* (2013.01); *H03F 2203/21112* (2013.01); *H03F 2203/21157* (2013.01)

(58) Field of Classification Search
CPC ....... H03F 220/294; H03F 2203/21112; H03F 2203/21157
USPC .......................................................... 375/147
See application file for complete search history.

(56) References Cited

U.S. PATENT DOCUMENTS

| | | | |
|---|---|---|---|
| 7,944,240 B2* | 5/2011 | Byeon | H03K 19/018528 326/86 |
| 8,681,045 B2 | 3/2014 | Hammes et al. | |
| 9,203,451 B2 | 12/2015 | Kehrer et al. | |
| 2005/0070232 A1 | 3/2005 | Mages et al. | |
| 2009/0079364 A1* | 3/2009 | Nagumo | G03G 15/326 327/108 |
| 2010/0189164 A1 | 7/2010 | Thind et al. | |
| 2013/0154868 A1 | 6/2013 | Kehrer et al. | |
| 2013/0176913 A1 | 7/2013 | Niskanen et al. | |
| 2020/0373995 A1* | 11/2020 | Ashworth | H04B 1/1607 |
| 2021/0036722 A1* | 2/2021 | Lim | H04B 1/0458 |
| 2022/0069775 A1* | 3/2022 | Balteanu | H04B 1/40 |
| 2023/0137019 A1* | 5/2023 | Kim | H04B 7/04 455/524 |

FOREIGN PATENT DOCUMENTS

| | | |
|---|---|---|
| CN | 102346253 A | 2/2012 |
| CN | 103166656 A | 6/2013 |
| CN | 103245960 A | 8/2013 |
| CN | 104035105 A | 9/2014 |
| CN | 104483685 A | 4/2015 |
| CN | 205986789 U | 2/2017 |
| CN | 105281682 B | 6/2018 |
| CN | 108181634 A | 6/2018 |
| CN | 108736909 A | 11/2018 |
| CN | 108933573 A | 12/2018 |
| CN | 109995410 A | 7/2019 |
| CN | 211880379 U | 11/2020 |
| CN | 213879813 U | 8/2021 |
| CN | 113346852 A | 9/2021 |
| CN | 113726357 A | 11/2021 |
| CN | 113805196 A | 12/2021 |
| CN | 114035212 A | 2/2022 |
| WO | 2011113540 A2 | 9/2011 |

OTHER PUBLICATIONS

Chen Hao, "Design of Muti-mode Muti-band GNSS Receiver RF Front-end", Xi'an University of Electronic Science and Technology, 2018.

T. Kaufmann and R. Bryant, "Adaptive GNSS Antenna Matching for Low-Cost Applications," 2020 14th European Conference on Antennas and Propagation (EuCAP), Copenhagen, Denmark, 2020, pp. 1-5.

Pan Zhenhe, "Front-end circuit design and implementation of GPS dual-frequency P code receiver", University of Chinese Academy of Sciences (National Space Science Center of Chinese Academy of Sciences)Beijing, 2008.

Filipe Palhinha, et al., "RF Front End Receiver for GPS/Galileo L1/E1", Procedia Technology, vol. 17, 2014, pp. 73-80.

* cited by examiner

RECEIVING MODULE, PACKAGING STRUCTURE, PRINTED CIRCUIT BOARD, AND ELECTRONIC DEVICE

CROSS-REFERECNE TO RELATED APPLICATIONS

This application is a national stage of International Application No. PCT/CN2023/070371, filed on Jan. 4, 2023, which claims priority to Chinese Patent Application No. 202210023122.7, filed on Jan. 10, 2022. The disclosures of both of the aforementioned applications are hereby incorporated by reference in their entireties.

TECHNICAL FIELD

This application relates to the field of radio frequency technologies, and in particular, to a receiving module, a packaging structure, a printed circuit board, and an electronic device.

BACKGROUND

A global navigation satellite system (global navigation satellite system, GNSS) is an important function of electronic devices (such as mobile phones, smart watches, and the like). A receiving front end of a GNSS receiver is usually provided with a filter and a low noise amplifier (low noise amplifier, LNA) to reduce interference and improve sensitivity of the GNSS. For an electronic device having a cellular communication function, a front filter is necessary to be provided at an input end of the LNA to suppress out-of-band interference and avoid that the LNA is blocked due to a high-power signal in cellular communication. For an electronic device having no cellular communication function, because there is no interference caused by high-power signals, the front filter may not be provided.

To meet use requirements in different scenarios, in general, a discrete device may be used. The LNA and the filter are provided at the receiving front end of the GNSS receiver. In a case that the cellular communication function is provided, a front filter is added to the input end of the LNA. However, using the discrete device occupies a relatively large space. Alternatively, the filter is integrated with the LNA, to reduce space occupied by the device. However, the filter is applicable as either a front application or a rear application. Therefore, application scenarios are relatively limited.

SUMMARY

Embodiments of this application provide a receiving module, a packaging structure, a printed circuit board, and an electronic device, to mitigate a problem that application scenarios of a front-end receiving module of an existing GNSS receiver are limited.

To achieve the foregoing objective, the following technical solutions are used in embodiments of this application.

According to a first aspect, an embodiment of this application provides a receiving module, where the receiving module includes a first radio frequency port, a second radio frequency port, a first filtering unit, an amplifying unit, and a control element, and the amplifying unit includes a first end and a second end. The first radio frequency port is connected to the first end of the amplifying unit by using the first filtering unit, and the second end of the amplifying unit is connected to the second radio frequency port. The control element is connected to the amplifying unit, and the control element is configured to control an operating mode of the amplifying unit. When the control element controls the amplifying unit to operate in a first mode, the first radio frequency port is configured to receive a signal, the first filtering unit is configured to filter the signal received by the first radio frequency port, and the amplifying unit is configured to amplify the filtered signal and output the amplified signal to the second radio frequency port. In this case, the first filtering unit acts as a front filtering unit. When the control element controls the amplifying unit to operate in a second mode, the second radio frequency port is configured to receive a signal, the amplifying unit is configured to amplify the signal received by the second radio frequency port, the first filtering unit is configured to filter the amplified signal and output the filtered signal to the first radio frequency port. In this case, the first filtering unit acts as a rear filtering unit for using the control element to control the amplifying unit to switch the operating mode. A built-in filtering unit of the receiving module can act as a front filtering unit or a rear filtering unit, which can be applied to different application scenarios.

In a possible implementation, the amplifying unit includes a first transistor, a second transistor, a third transistor, a first switch, and a second switch. A gate of the first transistor is connected to the first end of the amplifying unit, a source of the first transistor is grounded, and a drain of the first transistor is connected to a source of the third transistor. A gate of the second transistor is connected to the second end of the amplifying unit, a source of the second transistor is grounded, and a drain of the second transistor is connected to the source of the third transistor. A drain of the third transistor is connected to a first power supply, the drain of the third transistor is further connected to the second end of the amplifying unit by using the first switch, and the drain of the third transistor is further connected to the first end of the amplifying unit by using the second switch.

In a possible implementation, the control element is configured to control the first transistor and the third transistor to operate in an amplify state, control the second transistor to be cut off, control the first switch to be turned on, and control the second switch to be turned off, so that the amplifying unit operates in the first mode. The control element controls the operating state of the first transistor, the third transistor, and the first switch, so that the amplifying unit can operate in the first mode.

In a possible implementation, the control element is configured to control the second transistor and the third transistor to operate in an amplify state, control the first transistor to be cut off, control the second switch to be turned on, and control the first switch to be turned off, so that the amplifying unit operates in the second mode.

When the amplifying unit operates in the first mode, the first transistor and the third transistor operate in an amplify state, the first switch is turned on, the first transistor and the third transistor form an amplifying circuit to amplify a signal input from the first end of the amplifying unit, that is, from the gate of the first transistor, and the drain of the third transistor outputs the amplified signal and transmit the amplified signal to the second end of the amplifying unit through the first switch that is turned on. When the amplifying unit operates in the second mode, the second transistor and the third transistor operate in an amplify state, the second switch is turned on, the second transistor and the third transistor form an amplifying circuit to amplify a signal input from the second end of the amplifying unit and the gate of the second transistor, and the drain of the third transistor outputs the amplified signal and transmits the amplified signal to the first end of the amplifying unit through the second switch that is turned on. When the amplifying unit operates in different operating modes, a flow direction of the amplified signal of the amplifying unit can be changed, so that the filtering unit can act as a front filtering unit or a rear filtering unit.

In a possible implementation, the control element includes a first enabling end and a second enabling end. The two enabling ends can be used to control the operating mode of the amplifying unit. When the first enabling end is enabled, the control element is configured to control the amplifying unit to operate in the first mode. When the second enabling end is enabled, the control element is configured to control the amplifying unit to operate in the second mode.

In a possible implementation, the amplifying unit further includes a first capacitor, and a gate of the third transistor is grounded by using the first capacitor.

In a possible implementation, the receiving module further includes a first inductor, the first inductor is connected to the first end of the amplifying unit, and a second end of the first inductor is connected to the gate of the first transistor.

In a possible implementation, the receiving module further includes a second inductor, and the drain of the third transistor is connected to the first power supply by using the second inductor.

In a possible implementation manner, the first filtering unit includes a surface acoustic wave filter.

According to a second aspect, an embodiment of this application further provides a packaging structure, where the packaging structure includes a substrate and a receiving module disposed on the substrate, and the receiving module is the receiving module provided in the first aspect.

According to a third aspect, an embodiment of this application further provides a printed circuit board, where the printed circuit board includes a circuit board and a packaging structure disposed on the circuit board. The packaging structure is the packaging structure provided in the second aspect. The printed circuit board further includes a first pad group disposed in a first area of the circuit board and a second pad group disposed in a second area of the circuit board. The first pad group includes a first pad, a second pad, a third pad, and a fourth pad, and the second pad group includes a fifth pad, a sixth pad, a seventh pad, and an eighth pad. The first pad is connected to the fifth pad by using a first wiring line, and the fourth pad is connected to the eighth pad by using a second wiring line. The seventh pad is configured to connect to a global navigation satellite system GNSS receiver by using a third wiring line, and the second pad is configured to connect to an antenna by using a fourth wiring line. The third pad is configured to connect to the first radio frequency port by using a fifth wiring line, and the sixth pad is configured to connect to the second radio frequency port by using a sixth wiring line.

In a first possible implementation of the third aspect, the second pad is electrically connected to the third pad, and the sixth pad is electrically connected to the seventh pad.

In a second possible implementation of the third aspect, the second pad is electrically connected to the first pad, and the fifth pad is electrically connected to the sixth pad. The seventh pad is electrically connected to the eighth pad, and the fourth pad is electrically connected to the third pad.

In a third possible implementation of the third aspect, the third wiring line includes a second filtering unit.

In a fourth possible implementation of the third aspect, the third wiring line further includes a third pad group disposed in a third area of the circuit board, the third pad group includes a ninth pad and a tenth pad, the ninth pad is electrically connected to the seventh pad, and the tenth pad is configured to connect to the GNSS receiver. The second filtering unit includes a signal input end and signal output end, where the ninth pad is further electrically connected to the signal input end of the second filtering unit, the tenth pad is further connected to the signal output end of the second filtering unit; or the ninth pad is electrically connected to the tenth pad. When a rear filtering unit needs to be configured, the second filtering unit can act as the rear filtering unit. When the rear filtering unit does not need to be configured, the second filtering unit can be short circuited by using the ninth pad and the tenth pad.

According to a fourth aspect, an embodiment of this application provides an electronic device. The electronic device includes a GNSS receiver and a receiving module, where the receiving module is the receiving module provided in the first aspect, and the GNSS receiver is connected to the first radio frequency port or the second radio frequency port of the receiving module.

According to a fifth aspect, an embodiment of this application provides an electronic device. The electronic device includes an antenna, a GNSS receiver, and a printed circuit board, where the printed circuit board is the printed circuit board provided in the fourth aspect, and the printed circuit board includes a second pad and a seventh pad. The second pad is connected to the antenna by using a fourth wiring line, and the seventh pad is electrically connected to the GNSS receiver by using a third wiring line.

A sixth aspect provides an electronic device having a cellular communication function, where the electronic device includes an antenna, a GNSS receiver, and the printed circuit board provided in the first possible implementation of the third aspect.

The second pad is connected to the antenna by using the fourth wiring line, and the seventh pad is electrically connected to the GNSS receiver by using the third wiring line.

A seventh aspect provides an electronic device having no cellular communication function, where the electronic device includes an antenna, a GNSS receiver, and the printed circuit board according to the second possible implementation of the third aspect.

The second pad is connected to the antenna by using the fourth wiring line, and the seventh pad is electrically connected to the GNSS receiver by using the third wiring line.

For the technical effects brought by any one of the design methods according to the second to seventh aspects, reference may be made to the technical effects brought by different implementations in the first aspect, and details are not described herein again.

DETAILED DESCRIPTION OF EMBODIMENTS

A global navigation satellite system (global navigation satellite system, GNSS) is a radio navigation and positioning system that can provide position coordinates, a speed, and time information for users at any place on an earth surface or in the near-earth space, which is an important function of smart phones, smart watches, tablet computers, navigation terminals, and other electronic devices. A basic component of a GNSS user device is a GNSS receiver. The GNSS receiver is used to receive a radio signal transmitted by a GNSS satellite, obtain necessary navigation and positioning information and observation information, and complete various tasks such as navigation, positioning, and time serving after data processing.

A GNSS user device usually includes a GNSS receiver, an antenna thereof, and a microprocessor. The receiver and the antenna are a core of the user device. In general, the antenna and the GNSS receiver are separately assembled into two independent components. The antenna is placed in a position at which a signal is strong, and the GNSS receiver is placed in an appropriate position in the user device. The antenna and the receiver are connected through a cable, or the two components may be provided as a whole.

The GNSS receiver can receive a to-be-measured satellite signal based on a requirement of a given satellite elevation, and calculate a geographic longitude and latitude, a height, a speed, time, and other information about a position of a user based on the received satellite signal and a positioning resolving method.

Figure 1:
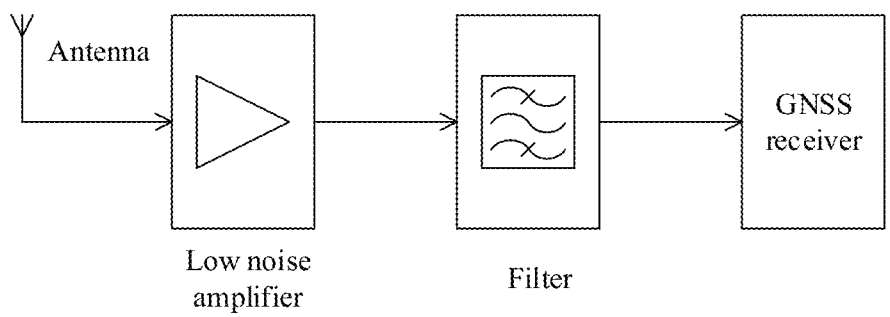
FIG. 1 is a schematic diagram of a receiving module according to an embodiment of this application.

The GNSS receiver can receive a signal transmitted by a satellite. At a receiving front end of the GNSS receiver, it is usually necessary to dispose a low noise amplifier and a filter to suppress out-of-band interference and improve sensitivity. As shown in FIG. 1, the arrows in the figure denote flow directions of a signal.

In a communications system, a filter usually needs to be disposed at an input end of an LNA to suppress out-of-band interference. The filter disposed at the input end of the LNA is referred to as a front filter, and a filter disposed at an output end of the LNA is referred to as a rear filter. For electronic devices such as smart phones, smart watches, and tablet computers, whether the front filter needs to be provided can be determined based on an actual usage scenario.

For example, for electronic devices such as smart phones, smart watches, and tablet computers that have a cellular communication function, a high-power signal for cellular communication falls into a GNSS band. This likely causes LNA blocking, resulting in a decreased LNA amplification gain, and a decreased noise factor. In addition, out-of-band noises cause a high noise floor and a high noise factor. Therefore, for electronic devices such as smart phones, smart watches, and tablet computers that have a cellular communication function, a front filter needs to be disposed at the input end of the LNA to eliminate interference out of the GNSS band.

For an electronic device having no cellular communication function, there is no interference caused by a high-power signal. Therefore, the front filter is not needed, so that insertion loss is reduced and GNSS sensitivity is improved. To be specific, the electronic device having no cellular communication function needs to be provided with only a rear filter, while an electronic device having a cellular communication function needs to be further provided with a front filter.

Figure 2:
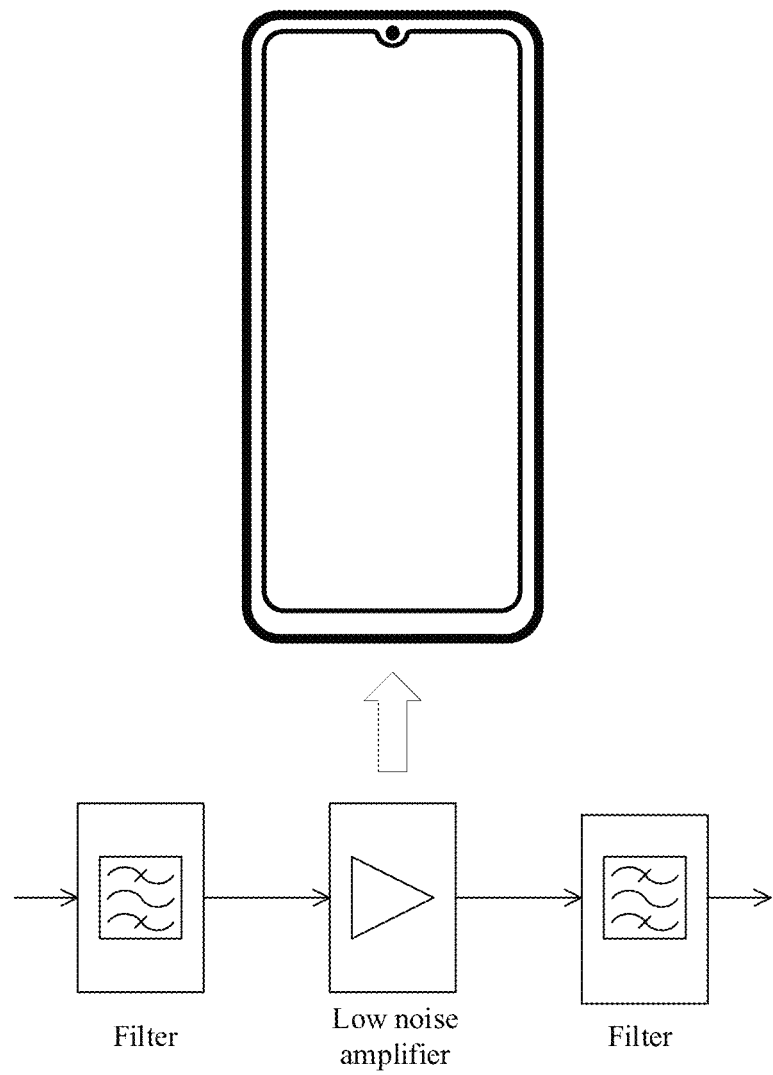
FIG. 2 is a schematic diagram of a receiving module including a discrete device according to an embodiment of this application.
Figure 3:
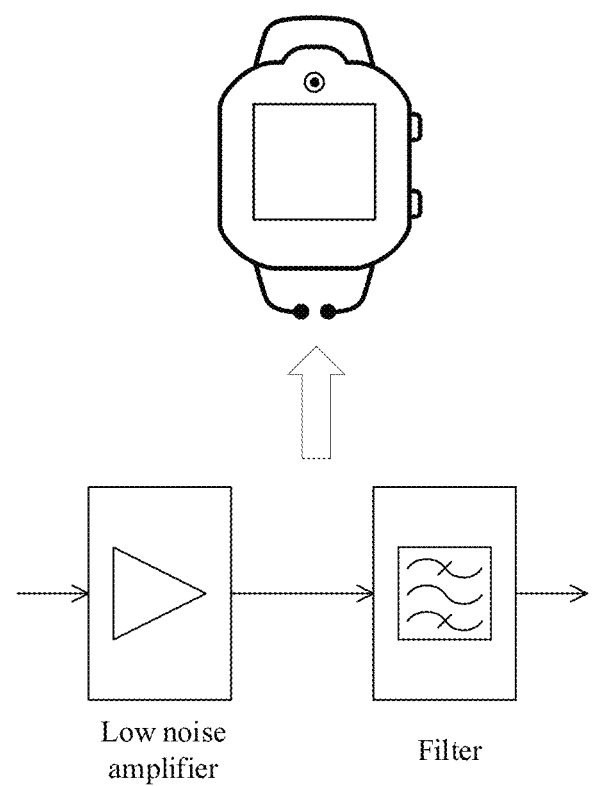
FIG. 3 is a schematic diagram of another receiving module including a discrete device according to an embodiment of this application.

To apply devices such as a low noise amplifier and a filter to an electronic device having a cellular communication function or an electronic device having no cellular communication function, in some possible implementations, a solution in which a discrete device is provided or a solution in which an integrated device is provided is used. In the solution in which a discrete device is provided, when being applied to an electronic device having a cellular communication function, an LNA and a filter are provided separately. As shown in FIG. 2, for example, when being applied to a mobile phone having a cellular communication function, two filters may be provided and disposed respectively at an input end and an output end of an LNA. When being applied to an electronic device having no cellular communication function, as shown in FIG. 3, for example, when being applied to a smart watch or a smart band having no cellular communication function, one filter may be provided and disposed at an output end of an LNA.

According to a conventional packaging area of a device, a size of the LNA is approximately 0.77 square millimeters, and a size of the filter is approximately 0.99 square millimeters. When being applied to an electronic device having a cellular communication function, the solution in which the front filter and the rear filter are separately provided requires a packaging area of approximately 2.75 square millimeters. When being applied to an electronic device having no cellular communication function, the solution in which only the rear filter is provided requires a packaging area of approximately 1.76 square millimeters. It can be learned that when the solution in which a discrete device is provided, a total area occupied by all devices is large, which is not conducive to design requirements of electronic devices for miniaturization and integration.

Figure 4:
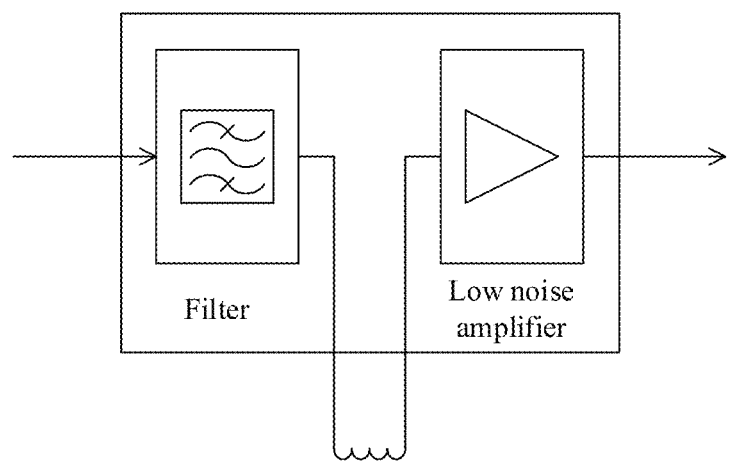
FIG. 4 is a schematic diagram of an integrated receiving module according to an embodiment of this application.

In addition to the solution in which a discrete device is provided described above, the solution in which an integrated device is provided can also be used. In the solution in which an integrated device is provided, a low noise amplifier and a filter can be integrated into a system-in-a-package (system in a package, SIP) module. FIG. 4 shows an integrated receiving module. One front filter and one low noise amplifier are integrated into one SIP module, and an input matching inductor required by the low noise amplifier is disposed outside the module. An area of the module is generally 1.65 square millimeters. If a design of sizes of the low noise amplifier and the filter is optimized, a total area of the module may be reduced to 1.43 square millimeters. Compared to the solution in which a discrete device is provided, the area of the module is reduced. However, the filter in the integrated module is used as a front end and is only applicable to an electronic device having a cellular communication function.

Figure 5:
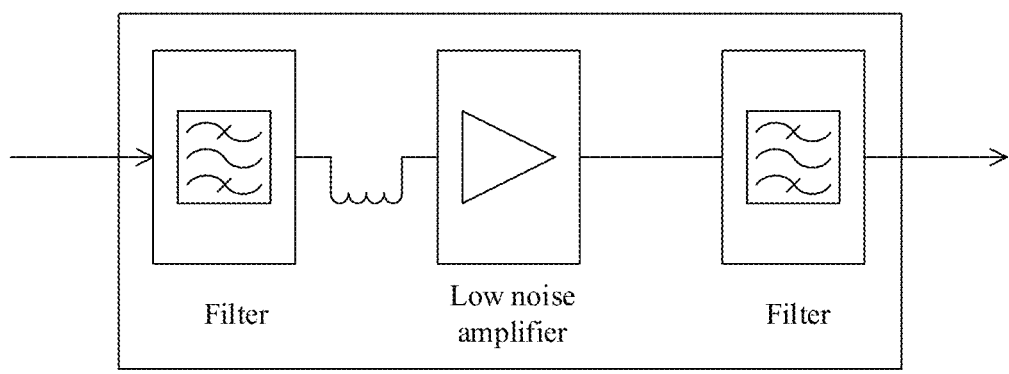
FIG. 5 is a schematic diagram of another integrated receiving module according to an embodiment of this application.

FIG. 5 shows another integrated receiving module. Two filters and one low noise amplifier are packaged in one SIP module. An input matching inductor required by the low noise amplifier is disposed inside the module. An input end and an output end of the low noise amplifier are respectively provided with a front filter and a rear filter. An area of the module is approximately 1.69 square millimeters. However, the two filters that are disposed inside the module are respectively the front filter and the rear filter and are only applicable to an electronic device having a cellular communication function.

Although the solution in which an integrated device is provided can reduce the area occupied by the device, the filter is used as either a front end or a rear end (or both the front filter and the rear filter are provided), resulting in limited application scenarios for the integrated module which cannot be flexibly applied to electronic devices having different functions.

To mitigate the above problem, this application provides a receiving module. The receiving module is applied to an electronic device. The electronic device may be a smart phone, a tablet computer, a smart watch, or the like, or may be another electronic device having a GNSS function, such as a navigation terminal. An example in which the electronic device is a mobile phone is used for description of the electronic device provided in embodiments of this application.

Figure 6:
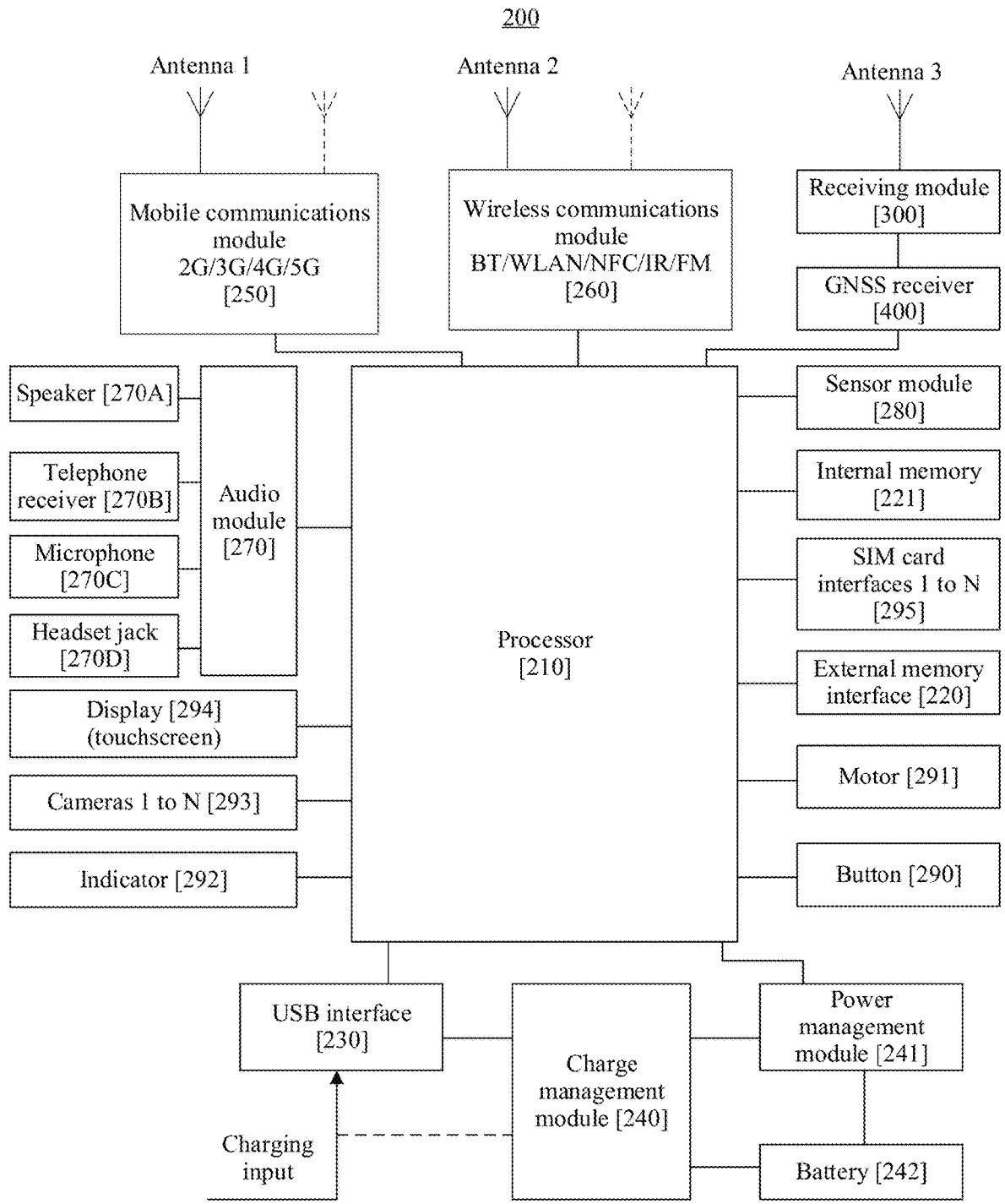
FIG. 6 is a schematic diagram of an electronic device according to an embodiment of this application.

Refer to FIG. 6. The electronic device 200 may include a processor 210, an external memory port 220, an internal memory 221, a universal serial bus (universal serial bus, USB) port 230, a charge management module 240, a power management module 241, a battery 242, an antenna 1, an antenna 2, an antenna 3, a mobile communications module 250, a wireless communications module 260, an audio module 270, a speaker 270A, a receiver 270B, a microphone 270C, an earphone port 270D, a sensor module 280, a key 290, an engine 291, an indicator 292, a camera 293, a display 294, a subscriber identification module (subscriber identification module, SIM) card port 295, a receiving module 300, a GNSS receiver 400, and the like.

The sensor module 280 may include a pressure sensor, a gyroscope sensor, an atmospheric pressure sensor, a magnetic sensor, an acceleration sensor, a distance sensor, a proximity light sensor, a fingerprint sensor, a temperature sensor, a touch sensor, an ambient light sensor, a bone conduction sensor, and the like.

It can be understood that the structure illustrated in embodiments of this application does not constitute a specific limitation on the electronic device 200. In some other embodiments, the electronic device 200 may include more or fewer components than those shown in the figure, or combine some of the components, split some of the components, or arrange the components differently. The illustrated components may be implemented by hardware, software, or a combination of software and hardware.

The processor 210 may include one or more processing units. For example, the processor 210 may include an application processor (application processor, AP), a modem processor, a graphics processing unit (graphics processing unit, GPU), an image signal processor (image signal processor, ISP), a controller, a memory, a video codec, a digital signal processor (digital signal processor, DSP), a baseband processor, a neural-network processing unit (neural-network processing unit, NPU), and/or the like. Different processing units may be separate devices or integrated into one or more processors.

The controller may be a core component and a command center of the electronic device 200. The controller may generate an operation control signal according to an instruction operation code and a timing signal, to control instruction fetch and instruction execution.

A memory may be further provided in the processor 210 to store instructions and data. In some embodiments, the memory in the processor 210 is a cache memory. The memory may store instructions or data that the processor 210 has just used or used cyclically. If the processor 210 needs to use the instructions or data again, the instructions or the data can be directly invoked from the memory, thereby avoiding repeated access, reducing waiting time of the processor 210, and improving system efficiency.

In some embodiments, the processor 210 may include one or more interfaces. The interface may include an inter-integrated circuit (inter-integrated circuit, I2C) interface, an inter-integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI), a general-purpose input/output (general-purpose input/output, GPIO) interface, a subscriber identity module (subscriber identity module, SIM) interface, a universal serial bus (universal serial bus, USB) interface, and/or the like.

It can be understood that the interface connection relationship between the modules illustrated in this embodiment is merely illustrative, and does not constitute a structural limitation on the electronic device 200. In some other embodiments, the electronic device 200 may alternatively adopt an interface connection mode different from the foregoing embodiment, or a combination of multiple interface connection modes.

The charge management module 240 is configured to receive charge input from a charger. The charger may be a wireless charger or a wired charger. The charge management module 240 may also supply power to a terminal device by using the power management module 241 while charging the battery 242.

The power management module 241 is configured to connect to the battery 242, the charge management module 240, and the processor 210. The power management module 241 receives input from the battery 242 and/or the charge management module 240, to supply power to the processor 210, the internal memory 221, an external memory, the display 294, the camera 293, the wireless communications module 260, and the like. In some embodiments, the power management module 241 and the charge management module 240 may alternatively be provided in a same device.

A wireless communication function of the electronic device 200 may be implemented by using the antenna 1, the antenna 2, the mobile communications module 250, the wireless communications module 260, the modem processor, the baseband processor, and the like. In some embodiments, the antenna 1 of the electronic device 200 is coupled to the mobile communications module 250, and the antenna 2 is coupled to the wireless communications module 260, so that the electronic device 200 can communicate with a network and another device by using a wireless communications technology.

The antenna 1 and the antenna 2 are configured to transmit and receive an electromagnetic wave signal. Each antenna of the electronic device 200 may be configured to cover one or a plurality of communication bands. Different antennas may also be reused to improve antenna utilization. For example, the antenna 1 may be reused as a diversity antenna of a wireless local area network. In some other embodiments, the antenna may be used in combination with a tuning switch.

The mobile communications module 250 may provide a wireless communication solution including 2G/3G/4G/5G and the like to be applied to the electronic device 200. The mobile communications module 250 may include at least one filter, a switch, a power amplifier, a low noise amplifier (low noise amplifier, LNA), and the like. The mobile communications module 250 may receive an electromagnetic wave by using the antenna 1, perform processing such as filtering and amplification on the received electromagnetic wave, and then transmit the electromagnetic wave to the modem processor for demodulation.

The mobile communications module 250 may also amplify a signal modulated by the modem processor, and convert it into an electromagnetic wave by using the antenna 1 for transmission. In some embodiments, at least some of functional modules of the mobile communications module 250 may be provided in the processor 210. In some embodiments, the mobile communications module 250 may include a cellular communication function. Certainly, the mobile communications module 250 may alternatively have no cellular communication function. At least some of functional modules of the mobile communications module 250 and at least some of modules of the processor 210 may be provided in a same device.

The wireless communications module 260 may provide wireless communication solutions such as a WLAN (for example, a (wireless fidelity, Wi-Fi) network), Bluetooth (Bluetooth, BT), frequency modulation (frequency modulation, FM), a near field communication (near field communication, NFC) technology, and an infrared (infrared, IR) technology to be applied on the electronic device 200.

The wireless communications module 260 may be one or more devices integrated with at least one communication processing module. The wireless communications module 260 receives an electromagnetic wave by using the antenna 2, performs frequency modulation and filtering on the electromagnetic wave signal, and sends the processed signal to the processor 210. The wireless communications module 260 may also receive a to-be-sent signal from the processor 210, perform frequency modulation and amplification on the signal, and convert it into an electromagnetic wave by using the antenna 2 for transmission.

The receiving module 300 and the GNSS receiver 400 can provide a global navigation satellite system function that is applied to the electronic device 200. The antenna 3 is configured to receive a satellite signal. The receiving module 300 performs filtering, amplification, and other processing on the satellite signal received by the antenna 3, and then transmits the signal to the GNSS receiver 400. The GNSS receiver 400 performs digital processing on the signal processed by the receiving module 300, and outputs the digital signal to the baseband processor. The baseband processor performs a series of digital signal processing on the signal to recover original positioning information broadcast by the satellite. The processor 210 resolves a position of a phase center of the antenna and a moving speed of the receiver based on the original positioning information, thereby implementing positioning, speed measurement, and other functions.

The receiving module 300 may be independently disposed and receive a satellite signal by using the antenna 3, and the receiving module 300 may alternatively be integrated in the wireless communications module 260 and receive a satellite signal by using the antenna 2.

The electronic device 200 implements a display function by using a GPU, the display 294, an application processor, and the like. The GPU is an image processing microprocessor, and is connected to the display 294 and the application processor. The GPU is configured to perform mathematical and geometric calculation for graphic rendering. The processor 210 may include one or more GPUs that execute program instructions to generate or change displayed information.

The display 294 is configured to display an image, a video, and the like. The display 294 includes a display panel.

The electronic device 200 may implement a shooting function by using the ISP, the camera 293, the video codec, the GPU, the display 294, an application processor, and the like. The ISP is configured to process data fed back by the camera 293. The camera 293 is configured to capture a still image or a video. In some embodiments, the electronic device 200 may include one or N cameras 293, where N is a positive integer greater than 1.

The external memory port 220 may be configured to connect to an external memory card, such as a Micro SD card, to expand a storage capacity of the electronic device 200. The external memory card communicates with the processor 210 by using the external memory port 220 to implement a data storage function, for example, saving music, video, and other files in the external memory card.

The internal memory 221 may be configured to store computer executable program code. The executable program code includes instructions. The processor 210 implements various functional application and data processing of the electronic device 200 by running the instructions stored in the internal memory 221. For example, in embodiments of this application, the processor 210 may perform the instructions stored in the internal memory 221. The internal memory 221 may include a storage program area and a storage data area.

The storage program area may store an operating system, an application program required by at least one function (for example, a sound-play function and an image play function), and the like. The data storage area may store data (for example, audio data and a phone book) created during the use of the electronic device 200. In addition, the internal memory 221 may include a high-speed random-access memory, or may include a non-volatile memory such as at least one magnetic disk storage device, a flash memory device, and a universal flash storage (universal flash storage, UFS).

The electronic device 200 may implement an audio function by using the audio module 270, the speaker 270A, the receiver 270B, the microphone 270C, the earphone port 270D, the application processor, and the like. For example, the audio functions include music playback and sound recording.

The key 290 includes a power-on key, a volume key, and the like. The key 290 may be a mechanical key, or a touch key. The engine 291 may generate a vibration prompt. The engine 291 may be used for vibration prompt for an incoming call, and may also be used for vibration feedback for a touch. The indicator 292 may be an indication lamp and may be configured to indicate a charging status, a power change, a message, a missed call, a notification, and the like. The SIM card port 295 is configured to connect to a SIM card. The SIM card may be inserted into the SIM card port 295 or pulled out from the SIM card port 295, to come into contact with and separate from the electronic device 200. The electronic device 200 may support 1 or N SIM card ports, where N is a positive integer greater than 1. The SIM card port 295 may support a nano-SIM card, a micro-SIM card, an SIM card, and the like.

The receiving module in the following embodiments can be implemented in the electronic device 200 having the above hardware structures.

Figure 7:
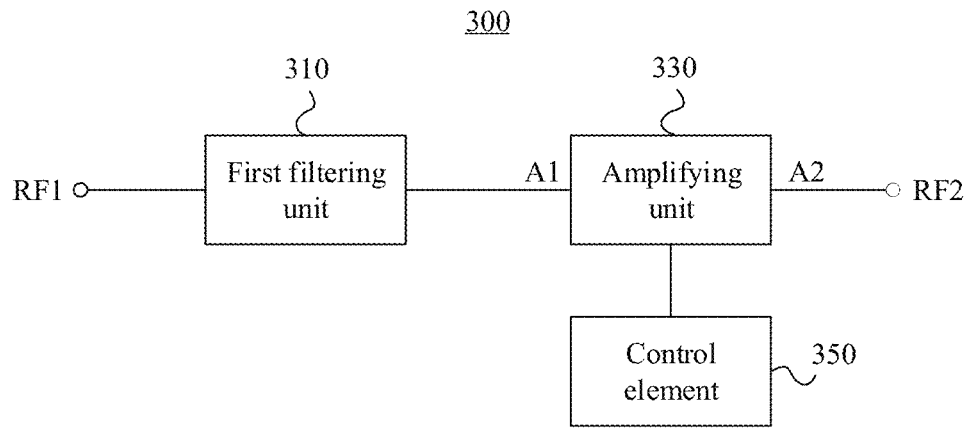
FIG. 7 is a schematic diagram of another receiving module according to an embodiment of this application.

For example, FIG. 7 is a schematic diagram of a receiving module 300 according to an embodiment of this application. The receiving module 300 includes a first radio frequency port RF1, a second radio frequency port RF2, a first filtering unit 310, an amplifying unit 330, and a control element 350. The amplifying unit 330 includes a first end A1 and a second end A2. The first radio frequency port RF1 is connected to the first end A1 of the amplifying unit 330 by using the first filtering unit 310, and the second end A2 of the amplifying unit 330 is connected to the second radio frequency port RF2. The control element 350 is connected to the amplifying unit 330, and the control element 350 is configured to control an operation mode of the amplifying unit 330.

Figure 8:
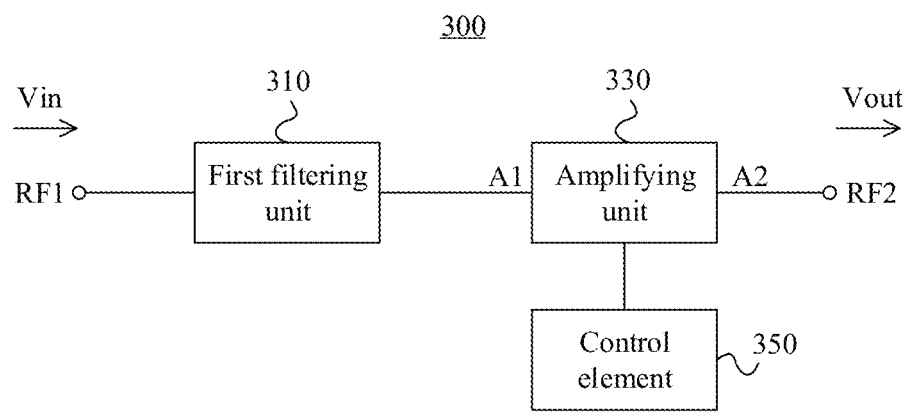
FIG. 8 is a schematic diagram of an operating mode of a receiving module according to an embodiment of this application.

One of the first radio frequency port RF1 and the second radio frequency port RF2 is configured to receive a signal, and the other one is configured to output a signal processed by the receiving module 300. For example, as shown in FIG. 8, when the amplifying unit 330 operates in a first mode, the first radio frequency port RF1 is configured to connect to the antenna 3 of the electronic device 200 to receive a signal Vin, and the first filtering unit 310 is configured to filter the signal received by the first radio frequency port RF1. The filtered signal is transmitted to the first end A1 of the amplifying unit 330. The amplifying unit 330 is configured to amplify the filtered signal of the first filtering unit 310. An amplified signal Vout is output from the second end A2 of the amplifying unit 330 to the second radio frequency port RF2. The second radio frequency port RF2 is connected to a GNSS receiver 400 of the electronic device 200, and the processed signal Vout is transmitted to the GNSS receiver 400 for processing.

Figure 9:
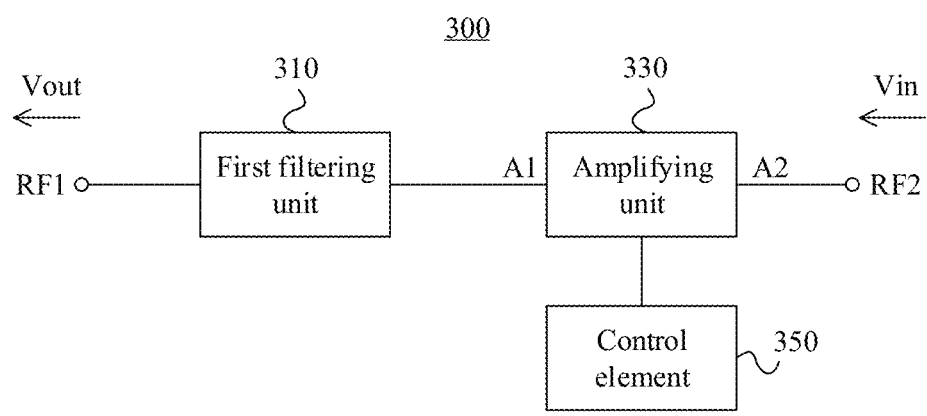
FIG. 9 is a schematic diagram of another operating mode of a receiving module according to an embodiment of this application.

For example, as shown in FIG. 9, when the amplifying unit 330 operates in a second mode, the second radio frequency port RF2 is configured to connect to the antenna 3 of the electronic device 200 and receive a signal Vin and transmit the signal Vin to the second end A2 of the amplifying unit 330. The amplifying unit 330 is configured to amplify the signal received by the second end A2, and output the amplified signal from the first end A1 of the amplifying unit 330 to the first filtering unit 310. The first filtering unit 310 is configured to filter the amplified signal, and output a filtered signal Vout to the first radio frequency port RF1. The first radio frequency port RF1 is connected to the GNSS receiver 400 of the electronic device 200, and the processed signal Vout is transmitted to the GNSS receiver 400 for processing.

When the amplifying unit 330 operates in the first mode, a flow direction of the signal in the amplifying unit 330 is from the first end A1 of the amplifying unit 330 to the second end A2 of the amplifying unit 330. In this case, the amplifying unit 330 amplifies a signal input from the first end A1 of the amplifying unit 330, and the amplified signal is output by the second end A2 of the amplifying unit 330. That is, the first end A1 of the amplifying unit 330 is an input end, and the second end A2 of the amplifying unit 330 is an output end. The first filtering unit 310 is connected to the first end A1 of the amplifying unit 330. In this case, the first filtering unit 310 can act as a front filtering unit.

When the amplifying unit 330 operates in the second mode, a flow direction of the signal in the amplifying unit 330 is from the second end A2 of the amplifying unit 330 to the first end A1 of the amplifying unit 330. In this case, the amplifying unit 330 amplifies a signal input from the second end A2 of the amplifying unit 330, and the amplified signal is output by the first end A1 of the amplifying unit 330. That is, the second end A2 of the amplifying unit 330 is an input end, and the first end A1 of the amplifying unit 330 is an output end. The first filtering unit 310 is connected to the first end A1 of the amplifying unit 330. In this case, the first filtering unit 310 can act as a rear filtering unit.

In the receiving module 300 provided in this embodiment of this application, the first filtering unit 310 is disposed at the first end A1 of the amplifying unit 330. However, by adjusting the operation mode of the amplifying unit 330, the first end A1 of the amplifying unit 330 can act as the input end, and the second end A2 of the amplifying unit 330 can act as the output end. In this case, the first filtering unit 310 is used as the front filtering unit, and can be applied to an electronic device having a cellular communication function, to avoid that a high-power signal of cellular communication falls within a GNSS band. In another operation mode, the first end A1 of the amplifying unit 330 can alternatively act as the output end, and the second end A2 of the amplifying unit 330 acts as the input end. In this case, the first filtering unit 310 can act as the rear filtering unit to reduce out-ofband interference of the GNSS receiver, and may be applied to a terminal having no cellular communication function, thereby broadening application scenarios of the receiving module 300 provided in this embodiment of this application.

Figure 10:
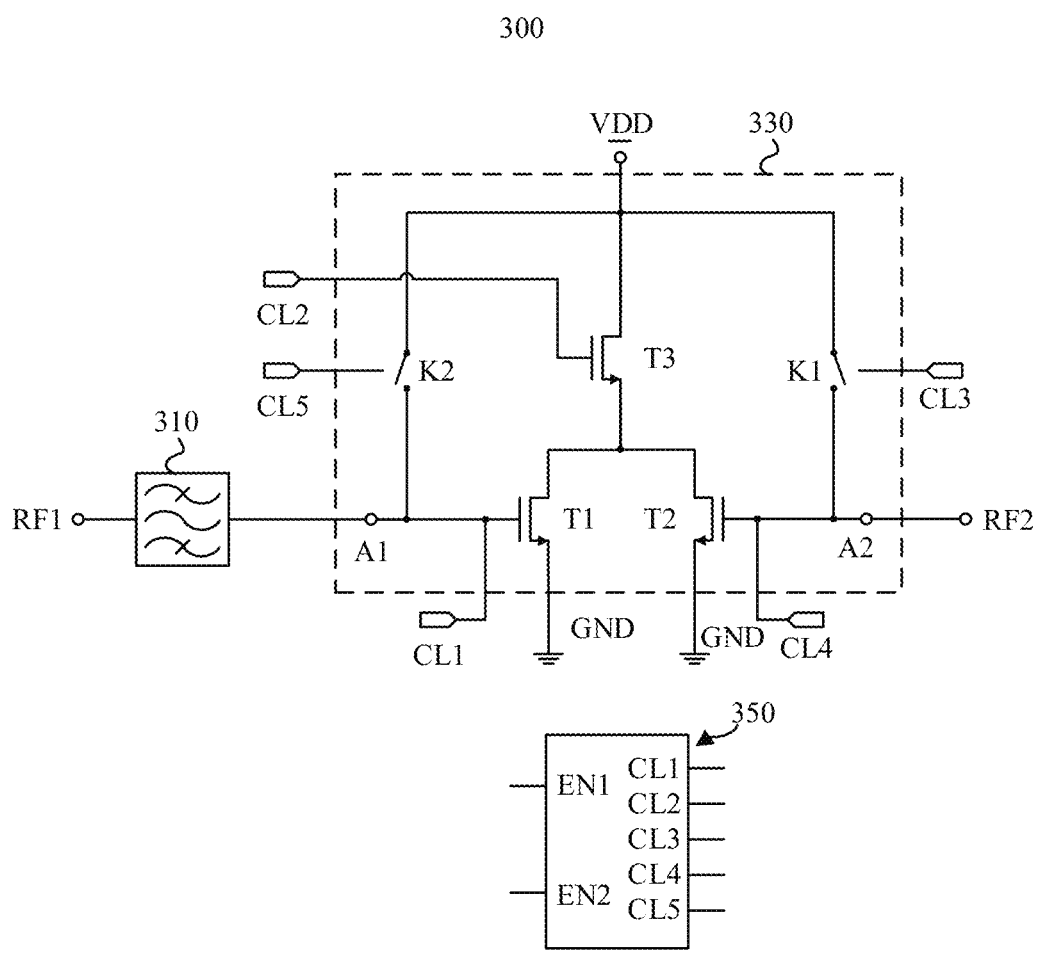
FIG. 10 is a schematic diagram depicting a circuit of a receiving module according to an embodiment of this application.

The amplifying unit 330 can adjust an operating direction in different operating modes. The following describes an implementation of the receiving module 300 provided in this embodiment of this application with reference to the accompanying drawings. FIG. 10 is a schematic diagram depicting a circuit structure of a receiving module 300 according to an embodiment of this application.

The first radio frequency port RF1 is connected to the first end A1 of the amplifying unit 330 by using the first filtering unit 310, and the second end A2 of the amplifying unit 330 is connected to the second radio frequency port RF2. The amplifying unit 330 includes a first transistor T1, a second transistor T2, a third transistor T3, a first switch K1, and a second switch K2. A gate of the first transistor T1 is connected to the first end A1 of the amplifying unit 330, a source of the first transistor T1 is grounded, and a drain of the first transistor T1 is connected to a source of the third transistor T3. A gate of the second transistor T2 is connected to the second end A2 of the amplifying unit 330, a source of the second transistor T2 is grounded, and a drain of the second transistor T2 is connected to the source of the third transistor T3. A drain of the third transistor T3 is connected to a first power supply VDD, the drain of the third transistor T3 is connected to the second end A2 of the amplifying unit 330 by using the first switch K1, and the drain of the third transistor T3 is further connected to the first end A1 of the amplifying unit 330 by using the second switch K2.

When the amplifying unit 330 operates in the first mode, the second transistor T2 is cut off, and the first transistor T1 and the third transistor T3 operate in an amplify state. The first transistor T1 and the third transistor T3 form an amplifying circuit to amplify a signal input from the first end A1 of the amplifying unit 330. The second switch K2 is turned off, and the first switch K1 is turned on, so that the amplified signal is transmitted from the second end A2 of the amplifying unit 330 to the second radio frequency port RF2.

When the amplifying unit 330 operates in the second mode, the first transistor T1 is cut off, and the second transistor T2 and the third transistor T3 operate in an amplify state. The second transistor T2 and the third transistor T3 form an amplifying circuit to amplify a signal input from the second end A2 of the amplifying unit 330. The first switch K1 is turned off, and the second switch K2 is turned on, so that the amplified signal is transmitted from the first end A1 of the amplifying unit 330 to the first radio frequency port RF1.

To control the operation mode of the amplifying unit 330, the receiving module 300 provided in this embodiment of this application uses the control element 350 to switch the operation mode of the amplifying unit 330. The control element 350 includes a first enabling end EN1, a second enabling end EN2, and a first control signal end CL1 to a fifth control signal end CL5.

The first enabling end EN1 and the second enabling end EN2 are configured to receive an enabling signal. When the first enabling end EN1 is enabled, the control element 350 controls the amplifying unit 330 to operate in the first mode. When the second enabling end EN2 is enabled, the control element 350 controls the amplifying unit 330 to operate in the second mode. The first control signal end CL1 is connected to the gate of the first transistor T1, the second control signal end CL2 is connected to a gate of the third transistor T3, the third control signal end CL3 is connected to the first switch K1, the fourth control signal end CL4 is connected to the gate of the second transistor T2, and the fifth control signal end CL5 is connected to the second switch K2.

Figure 11:
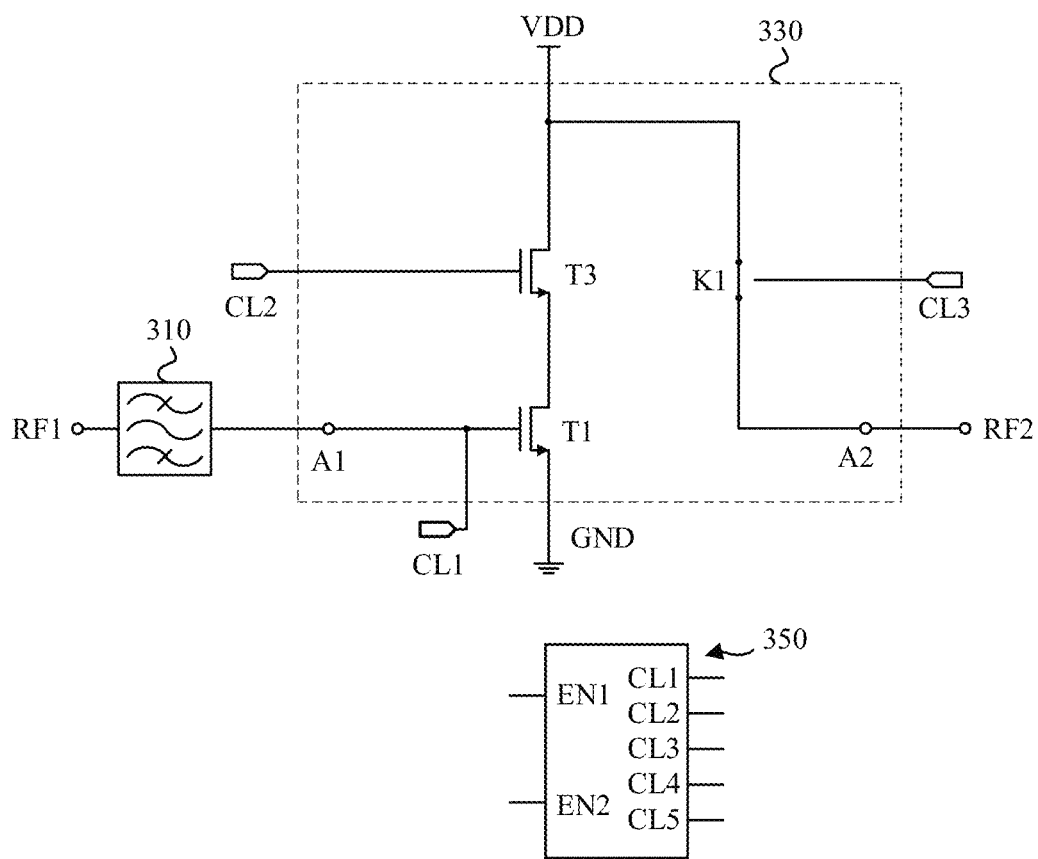
FIG. 11 is a schematic diagram depicting an equivalent circuit of an operating mode of a receiving module according to an embodiment of this application.

When the first enabling end EN1 is enabled, the first control signal end CL1 outputs a control signal to control the first transistor T1 to be conducted, the second control signal end CL2 outputs a control signal to control the third transistor T3 to be conducted, and the third control signal end CL3 outputs a control signal to control the first switch K1 to be turned on. In this case, the second transistor T2 is in a cut-off state or the fourth control signal end CL4 outputs a control signal to control the second transistor T2 to be cut off, and the second switch K2 is in an off state or the fifth control signal end CL5 outputs a control signal to control the second switch K2 to be turned off. FIG. 11 is a schematic diagram depicting an equivalent circuit of the receiving module 300 when the amplifying unit 330 operates in the first mode. The first transistor T1 and the third transistor T3 are in an on state to form an amplifying circuit to amplify a signal input from the gate of the first transistor T1, and the signal is output from the drain of the third transistor T3. In addition, the first switch K1 is in an on state, the second switch K2 is in an off state, and the amplified signal is transmitted to the second end A2 of the amplifying unit 330 through the drain of the third transistor T3 and the first switch K1, so that the signal input from the first end of the amplifying unit 330 is amplified and then output from the second end A2 of the amplifying unit 330. In this case, the first end A1 of the amplifying unit 330 acts as an input end, the second end A2 of the amplifying unit 330 acts as an output end, and the first filtering unit 310 disposed at the first end A1 of the amplifying unit 330 acts as a front filtering unit of the amplifying unit 330.

Figure 12:
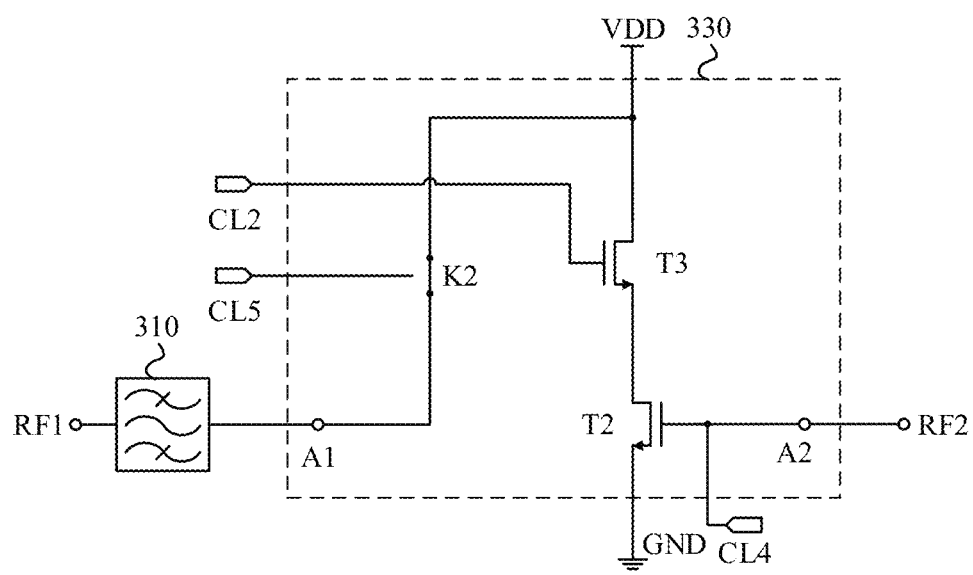
FIG. 12 is a schematic diagram depicting an equivalent circuit of another operating mode of a receiving module according to an embodiment of this application.
Figure 12:
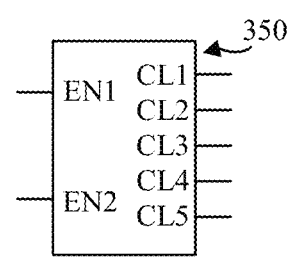

When the second enabling end EN2 is enabled, the second control signal end CL2 outputs a control signal to control the third transistor T3 to be conducted, the fourth control signal end CL4 outputs a control signal to control the second transistor T2 to be conducted, and the fifth control signal end CL5 outputs a control signal to control the second switch K2 to be turned on. In this case, the first transistor T1 is in a cut-off state or the first control signal end CL1 outputs a control signal to control the first transistor T1 to be cut off, and the first switch K1 is in an off state or the third control signal end CL3 outputs a control signal to control the first switch K1 to be turned off. FIG. 12 is a schematic diagram depicting an equivalent circuit of the receiving module 300 when the amplifying unit 330 operates in the second mode. The second transistor T2 and the third transistor T3 are in an on state to form an amplifying circuit to amplify a signal input from the gate of the second transistor T2, and the signal is output from the drain of the third transistor T3. In addition, the second switch K2 is in an on state, the first switch K1 is in an off state, and the amplified signal is transmitted to the first end A1 of the amplifying unit 330 through the drain of the third transistor T3 and the second switch K2, so that the signal input from the second end of the amplifying unit 330 is amplified and then output from the first end A1 of the amplifying unit 330. In this case, the second end A2 of the amplifying unit 330 acts as an input end, the first end A1 of the amplifying unit 330 acts as an output end, and the first filtering unit 310 disposed at the first end A1 of the amplifying unit 330 acts as a rear filtering unit of the amplifying unit 330.

The first filtering unit 310 is disposed at the first end A1 of the amplifying unit 330. When the amplifying unit 330 operates in different modes, the receiving module 300 provided in this embodiment of this application has different operating principles, and the first filtering unit 310 disposed in the receiving module 300 can act as a front filtering unit or a rear filtering unit, and can be applied in different scenarios. For example, when the amplifying unit 330 operates in the first mode, a signal input from the first end A1 of the amplifying unit 330 is amplified and then output from the second end A2 of the amplifying unit 330. In this case, the built-in first filtering unit 310 of the receiving module 300 acts as a front filtering unit, and can be applied to an electronic device having a cellular communication function. When the amplifying unit 330 operates in the second mode, a signal input from the second end A2 of the amplifying unit 330 and then output from the first end A1 of the amplifying unit 330. In this case, the built-first filtering unit 310 of the receiving module 300 acts as a rear filtering unit, and can be applied to an electronic device having no cellular communication function or an electronic device having a cellular communication function.

For example, the first transistor T1, the second transistor T2, and the third transistor T3 may be metal-oxide-semiconductor field effect transistors (metal-oxide-semiconductor field effect transistor, MOSFET), to reduce noises of the amplifying unit. Transistors are divided into two types: an N-type (negative, negative) transistor and a P-type (positive, positive) transistor. The transistor includes a first end (source), a second end (drain), and a gate (gate). By controlling an input level of the gate of the transistor, the transistor can be controlled to be conducted or cut off. When the transistor is conducted, the first end and the second end are conducted, thereby generating an on-current. In addition, when the level of the gate of the transistor is different, a magnitude of the on-current generated between the first end and the second end is also different. When the transistor is cut off, the first end and the second end are not conducted and do not generate a current. In embodiments of this application, the gate of the transistor is also referred to as a control end, the first end is referred to as a source, and the second end is referred to as a drain. In addition, when the level at the gate of the N-type field effect transistor is high, the N-type field effect transistor is conducted, and the source and the drain are conducted, thereby generating an on-current between the source and the drain. When the level at the gate of the N-type transistor is low, the N-type transistor is cut off, and the source and the drain are not conducted, thereby generating no current. When the level at the gate of the P-type field effect transistor is low, the P-type field effect transistor is conducted, the source and the drain are conducted, thereby generating an on-current. When the level at the gate of the P-type field effect transistor is high, the P-type field effect transistor is cut off, and the source and the drain are not conducted, thereby generating no current.

The first transistor T1, the second transistor T2, and the third transistor T3 may also be a bipolar junction transistor (bipolar junction transistor, BJT). To describe embodiments of this application in detail, in this embodiment of this application, examples in which all transistors are N-type field effect transistors are used for description, but are not intended to limit the solutions of this application.

When the first enabling end EN1 is enabled, the first control signal end CL1 and the second control signal end CL2 of the control element 350 output a high-level signal to control the first transistor T1 and the third transistor T3 to be conducted, and the fourth control signal end CL4 outputs a low-level signal or is in a dangling state to control the second transistor T2 to be cut off. When the second enabling end EN2 is enabled, the second control signal end CL2 and the fourth control signal end CL4 of the control element 350 output a high-level signal to control the second transistor T2 and the third transistor T3 to be conducted, and the first control signal end CL1 outputs a low-level signal or is in a dangling state to control the first transistor T1 to be cut off.

Figure 13:
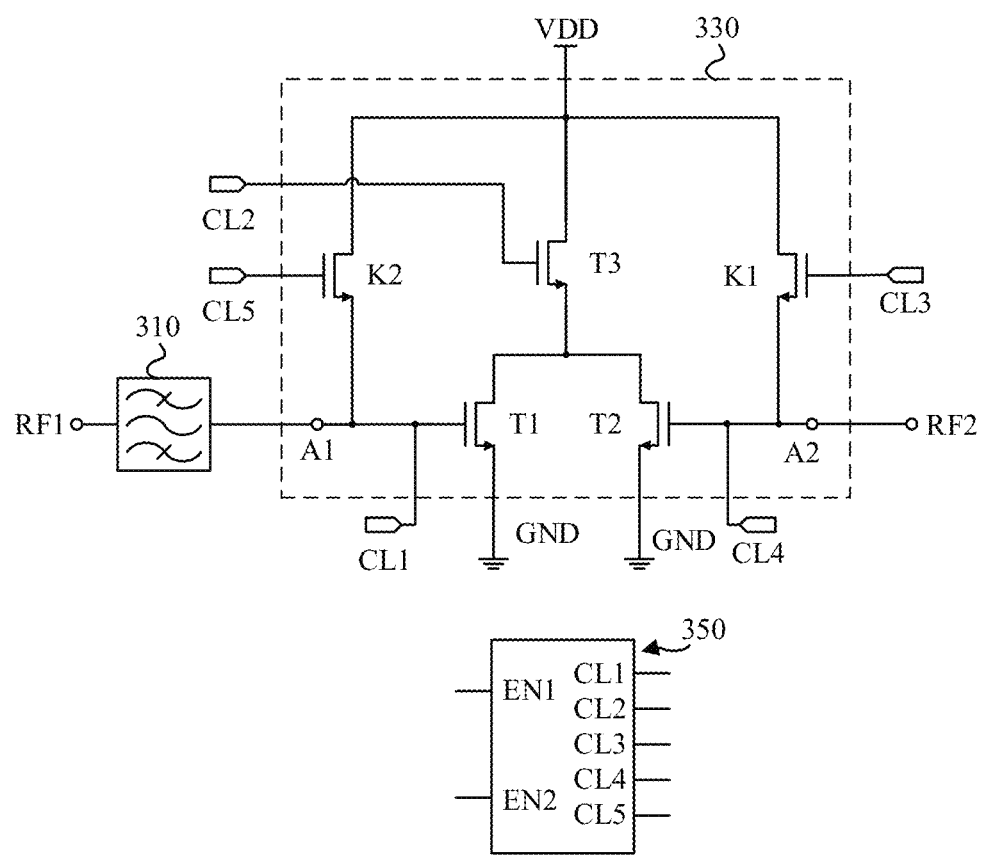
FIG. 13 is a schematic diagram depicting a circuit of another receiving module according to an embodiment of this application.

For example, refer to FIG. 13. The first switch K1 and the second switch K2 may also be N-type field effect transistors. The first switch K1 includes a gate, a source, and a drain, while the second switch K2 includes a gate, a source, and a drain. The gate of the first switch K1 is connected to the third control signal end CL3 of the control element 350, the source of the first switch K1 is connected to the second end A2 of the amplifying unit 330, and the drain of the first switch K1 is connected to the drain of the third transistor T3. The gate of the second switch K2 is connected to the fifth control signal end CL5 of the control element 350, the source of the second switch K2 is connected to the first end A1 of the amplifying unit 330, and the drain of the second switch K2 is connected to the drain of the third transistor T3.

When the first enabling end EN1 of the control element 350 is enabled, the third control signal end CL3 of the control element 350 controls the first switch K1 to be turned on, and a signal output from the drain of the third transistor T3 is transmitted to the second end A2 of the amplifying unit 330 through the first switch K1. When the second enabling end EN2 of the control element 350 is enabled, the fifth control signal end CL5 of the control element 350 outputs a control signal to control the second switch K2 to be turned on, and the signal output from the drain of the third transistor T3 is transmitted to the first end A1 of the amplifying unit 330 through the second switch K2.

In a possible implementation, the control element 350 may be an integrated circuit chip having the ability to output different control signals based on an enable signal. For example, the control element may be a central processing unit (Central Processing Unit, CPU), a digital signal processing (Digital Signal Processing, DSP), an application specific integrated circuit (Application Specific Integrated Circuit, ASIC), a field programmable gate array (Field Programmable Gate Array, FPGA), or another programmable logic device, a discrete gate or transistor logic device, or a discrete hardware component. This is not limited in embodiments of this application. In some other possible implementations, the control element 350 may also be a control circuit composed of a plurality of switches or transistors.

Figure 14:
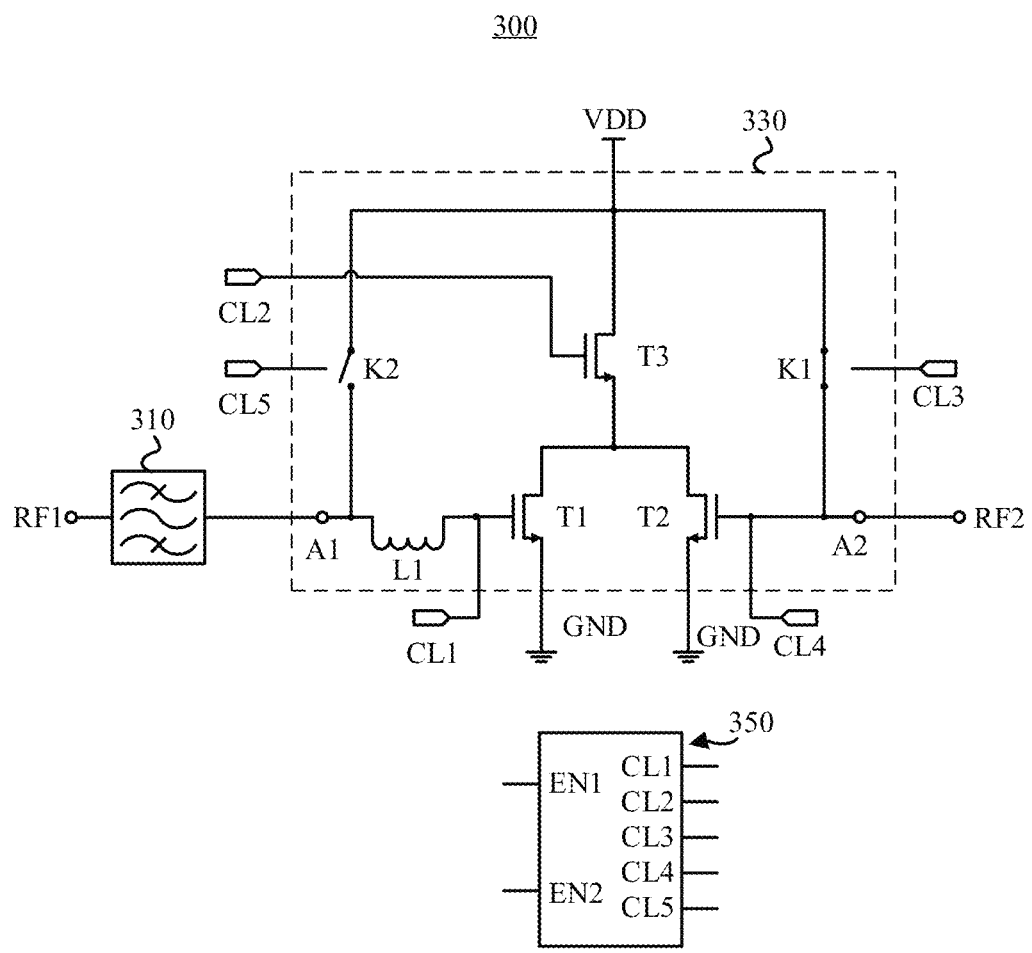
FIG. 14 is a schematic diagram depicting a circuit of still another receiving module according to an embodiment of this application.

For example, refer to FIG. 14. The amplifying unit 330 needs to perform impedance matching on an input signal. The receiving module 300 provided in embodiments of this application further includes a first inductor L1. The first inductor L1 is disposed between the first end A1 of the amplifying unit 330 and the gate of the first transistor T1. When the amplifying unit 330 operates in the first mode, the first inductor L1 can perform impedance matching on the input signal of the amplifying unit 330. When the amplifying unit 330 operates in the second mode, the amplified signal is output through the drain of the third transistor T3, the second switch K2, and the first end A1 of the amplifying unit 330, and the first inductor L1 does affect the signal.

It should be noted that when the amplifying unit 330 operates in the second mode, impedance matching still needs to be performed on the input signal. Because a size of the inductor is relatively large, the receiving module 300 provided in embodiments of this application may be provided with only one inductor, and the use requirements can be satisfied. When the amplifying unit 330 operates in the second mode, a matching inductor required by the amplifying unit 330 can be disposed outside the receiving module 300 to reduce the area occupied by the receiving module 300.

Figure 15:
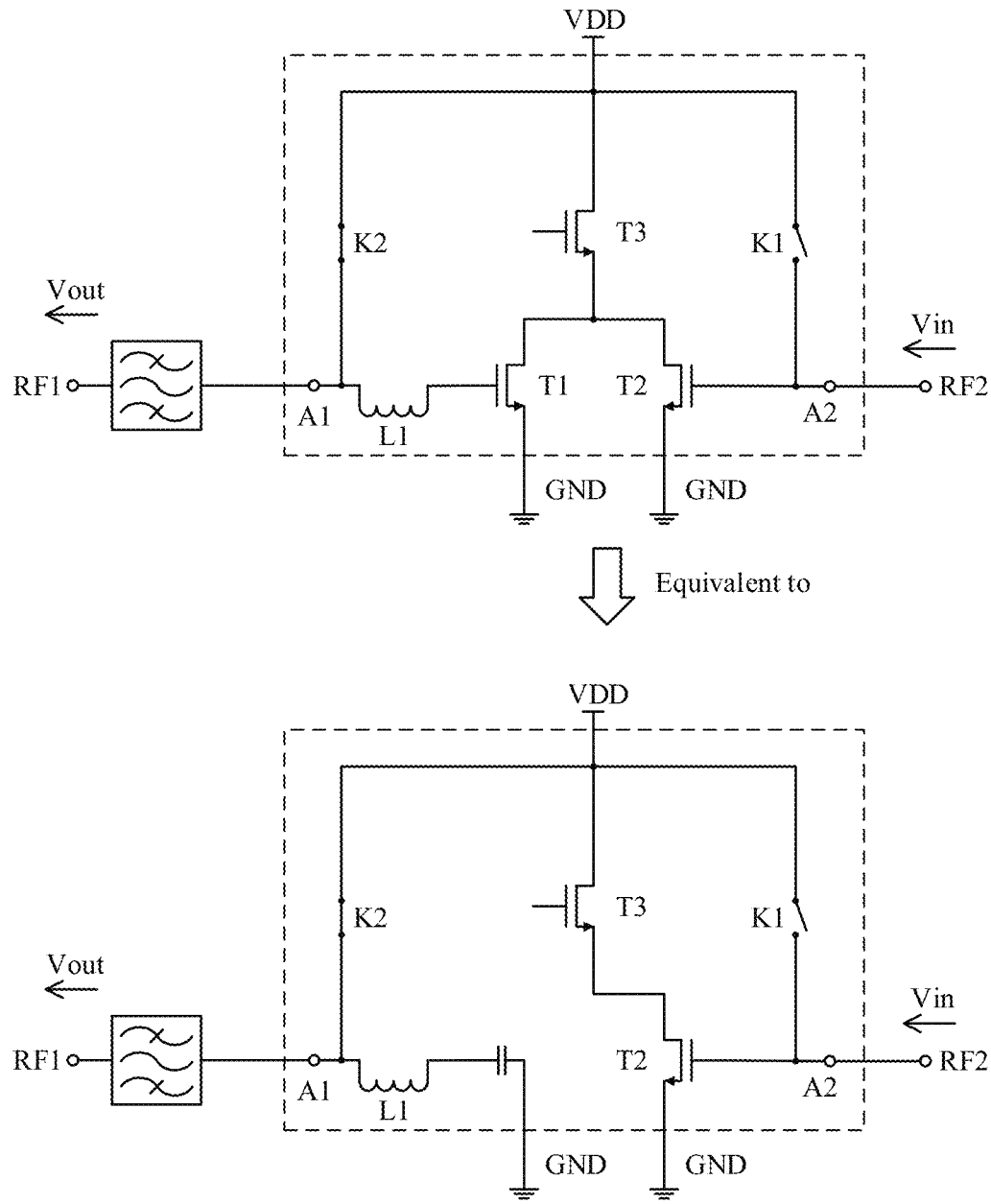
FIG. 15 is a schematic diagram depicting an equivalent circuit of another receiving module according to an embodiment of this application.

In addition, refer to FIG. 15 on a basis of FIG. 14. When the amplifying unit 330 operates in the second mode, the first transistor T1 is cut off, and the first inductor L1 and a parasitic capacitor of the first transistor T1 in a cut off state can form a series resonance. That is, a notch (notch) filter is disposed in a circuit of the entire receiving module 300, which can have a strengthened suppression on cellular signals at some frequencies.

Figure 16:
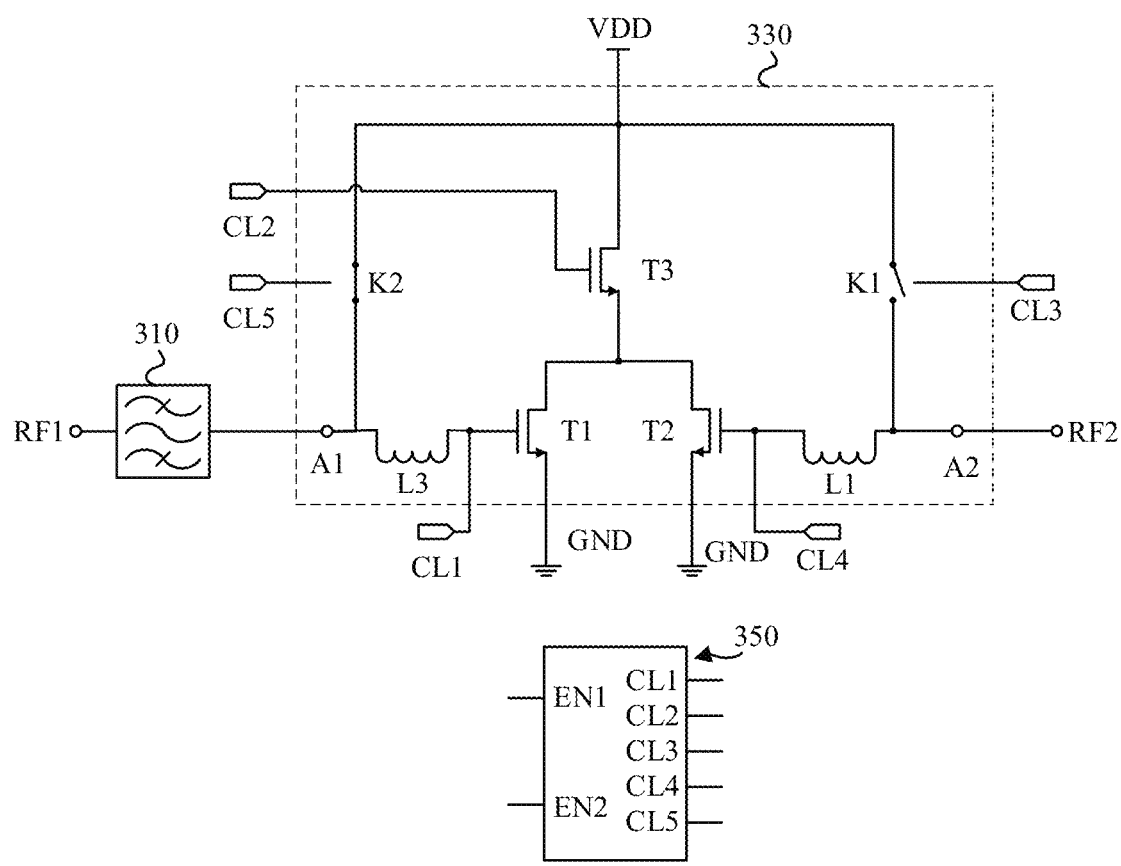
FIG. 16 is a schematic diagram depicting a circuit of yet another receiving module according to an embodiment of this application.

In another possible implementation, refer to FIG. 16. The first inductor L1 may be disposed between the second end A2 of the amplifying unit 330 and the gate of the second transistor T2. When the amplifying unit 330 operates in the second mode, the signal is input from the second radio frequency port RF2 and transmitted to the second end A2 of the amplifying unit 330. In this case, the first inductor L1 may be used to perform impedance matching on the input signal of the amplifying unit 330. In this case, if the amplifying unit 330 operates in the first mode, it is also necessary that the first end A1 of the amplifying unit 330 is provided with a matching inductor. However, because the receiving module 300 provided in this application integrates the filtering unit 310 with the amplifying unit 330, and the filtering unit 310 is disposed at the first end A1 of the amplifying unit 330, it is impossible that a matching inductor is disposed outside the first end A1 of the amplifying unit 330. Instead, the matching inductor may only be disposed inside the receiving module 300 (for example, the inductor L3 as shown in FIG. 16). In this way, two inductors are integrated and provided inside the receiving module 300, so that the area of the inductors are large, thereby having a significant impact on the entire area of the receiving module 300. Therefore, in general, the receiving module 300 provided in embodiments of this application is provided with only one matching inductor, and the matching inductor is disposed in the amplifying unit 330 on a side adjacent to the first filtering unit 310 (for example, the first inductor L1 as shown in FIG. 14).

Figure 17:
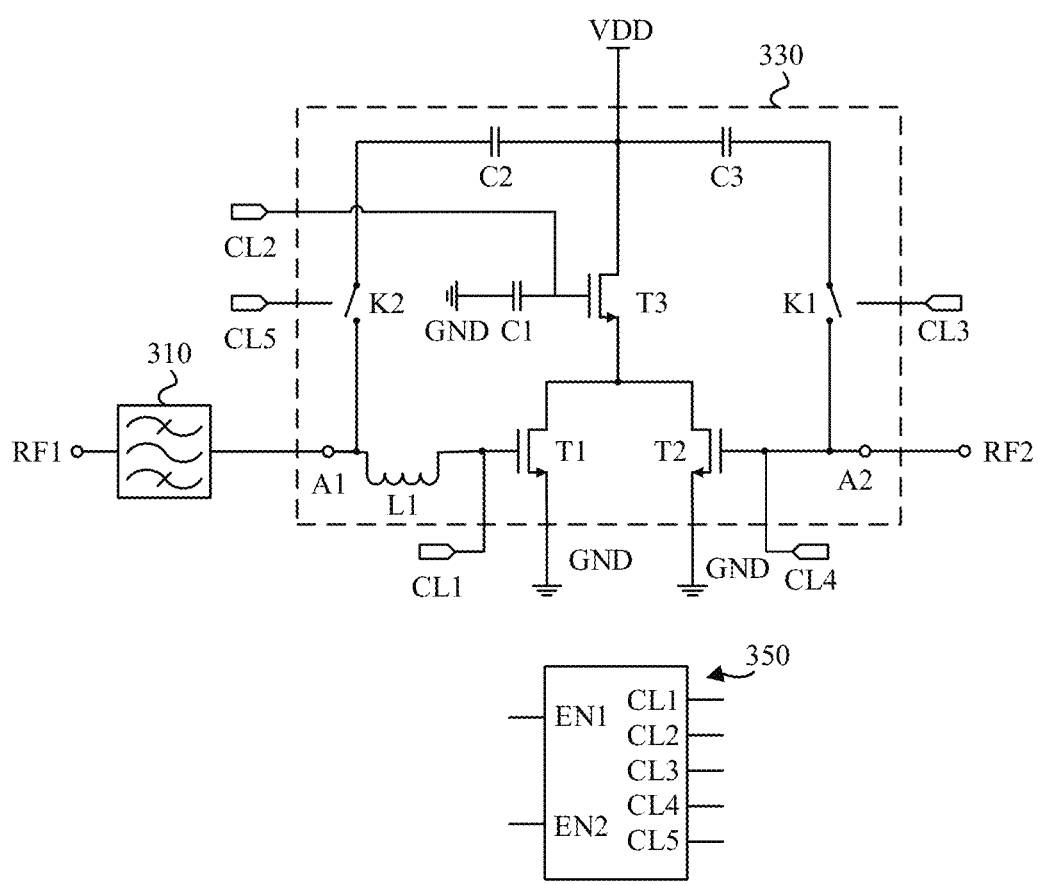
FIG. 17 is a schematic diagram depicting a circuit of still yet another receiving module according to an embodiment of this application.

For example, in another possible implementation, refer to FIG. 17. The amplifying unit 330 further includes a first capacitor C1, the gate of the third transistor T3 is grounded through the first capacitor C1, and a radio frequency signal of the gate of the third transistor T3 may be grounded through the first capacitor C1, and a direct-current signal such as a control signal may be blocked by the first capacitor C1.

In addition, to block the direct-current signal and prevent the power signal provided by the first power supply VDD from being applied to the gate of the first transistor T1 or the second transistor T2, a second capacitor C2 is disposed between the drain of the third transistor T3 and the second switch K2, and a third capacitor C3 is disposed between the drain of the third transistor T3 and the first switch K1. The second capacitor C2 and the third capacitor C3 can block the direct-current signal.

Figure 18:
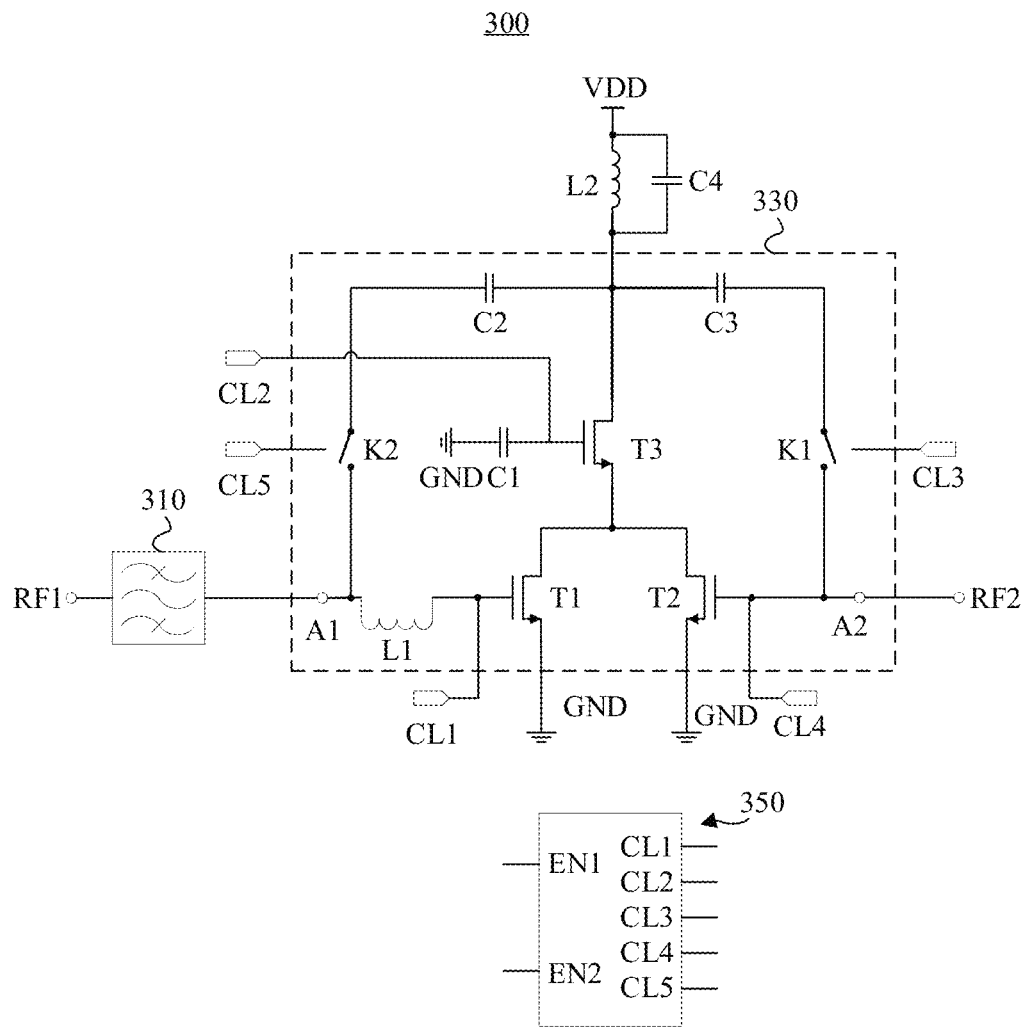
FIG. 18 is a schematic diagram depicting a circuit of a further receiving module according to an embodiment of this application.

For example, refer to FIG. 18. To reduce a power supply noise, an LC circuit may be disposed between the drain of the third transistor T3 and the first power supply VDD. In a possible implementation, the LC circuit may include a second inductor L2 and a fourth capacitor C4, and the second inductor L2 and the fourth capacitor C4 are connected in parallel. The second inductor L2 and the fourth capacitor C4 that are in parallel connection are disposed in series between the drain of the first power supply VDD and the third transistor T3, which can play a role of impedance matching while it can be avoided that the radio frequency signal is transmitted to the first power supply VDD.

It can be learned from the foregoing that the first filtering unit 310 is disposed between the first radio frequency port RF1 and the first end A1 of the amplifying unit 330. The first filtering unit 310 includes a first end and a second end. The first end of the first filtering unit 310 is connected to the first radio frequency port RF1, and the second end of the first filtering unit 310 is connected to the first end A1 of the amplifying unit 330. The first end A1 of the amplifying unit 330 may act as an input end of the amplifying unit 330 or as an output end of the amplifying unit 330. When the first end A1 of the amplifying unit 330 acts as the input end of the amplifying unit 330, the flow direction of the signal in the first filtering unit 310 is from the first end of the first filtering unit 310 to the second end of the first filtering unit 310. When the first end A1 of the amplifying unit 330 acts as the output end of the amplifying unit 330, the flow direction of the signal in the first filtering unit 310 is from the second end of the first filtering unit 310 to the first end of the first filtering unit 310.

For example, the first filtering unit 310 may be a surface acoustic wave (surface acoustic wave, SAW) filter. A surface acoustic wave is an elastic wave generated and propagated on a surface of a piezoelectric substrate material, where an amplitude of the elastic wave rapidly decreases as the wave propagate deeper into the substrate material. A basic structure of the SAW filter is that two sets of an electroacoustic transducer and an interdigital transducer (Interdigital Transducer, IDT) are provided on a polished surface of a substrate material having a piezoelectric characteristic, and each set acts as a transmitting transducer or a receiving transducer. The transmitting transducer converts a radio frequency signal into a surface acoustic wave that propagates on the surface of the substrate. After a certain delay, the receiving transducer converts the acoustic signal into an electrical signal for output. The filtering process is implemented in conversion between the electrical signal and the acoustic signal. Therefore, the SAW filter may be equivalent to a two-port passive network, which can act as a two-way filter, that is, as a front filtering unit or a rear filtering unit.

In another implementation of this application, the first filtering unit 210 may further be a low temperature co-fired ceramics (low temperature co-fired ceramics, LTCC) filter, an integrated passive device (integrated passive device, IPD) filter, and the like.

Figure 19:
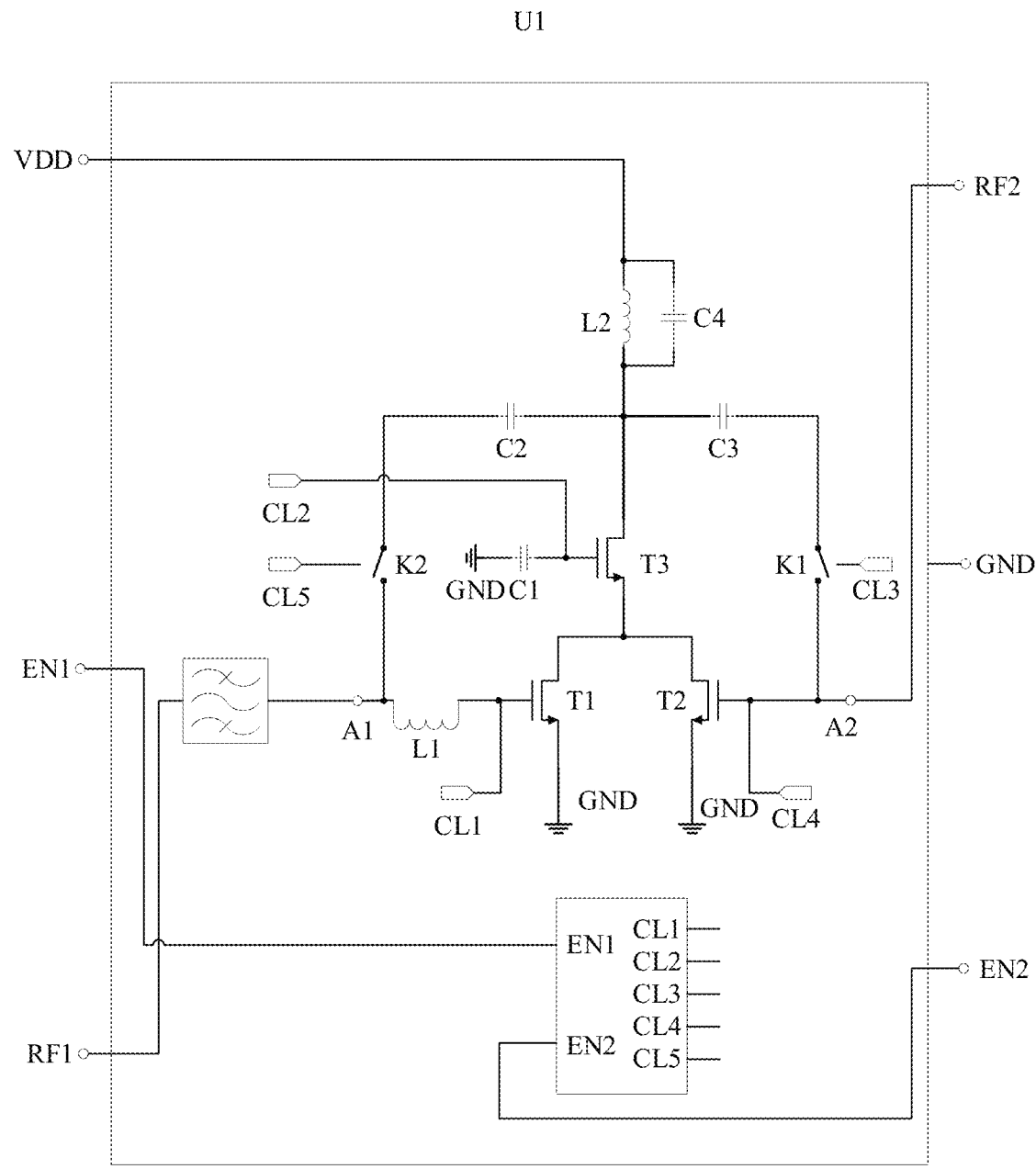
FIG. 19 is a schematic diagram depicting a circuit structure of a packaging structure according to an embodiment of this application.

The receiving module 300 provided in embodiments of this application can operate either in an operating mode in which the first filtering unit 310 is disposed as a front end or in an operating mode in which the first filtering unit 310 is disposed as a rear end, which can satisfy application requirements of different devices. Refer to FIG. 19. According to the receiving module 300 provided in embodiments of this application, an embodiment of this application further provides a packaging structure U1. The packaging structure U1 includes a substrate and a receiving module 300 disposed on the substrate. A connecting cable that connects an internal circuit of the receiving module 300 to an external circuit or component forms a plurality of pins (pins) on the substrate. For example, in a possible implementation, the substrate may be made of a ceramic material, a plastic material, and the like. The packaging structure U1 provided in this embodiment of this application includes a pin RF1, a pin RF2, a pin EN1, a pin EN2, a pin GND, and a pin VDD. The pin RF1 is a connecting cable between the first radio frequency port RF1 of the receiving module 300 and the external circuit or component, which is equivalent to the first radio frequency port RF1 of the receiving module 300. The pin RF2 is a connecting cable between the second radio frequency port RF2 of the receiving module 300 and the external circuit or component, which is equivalent to the second radio frequency port RF2 of the receiving module 300. The pin EN1 is a connecting cable between the first enabling end EN1 of the control element 350 and the external circuit or component, which is equivalent to the first enabling end EN1 of the receiving module 300. The pin EN2 is a connecting cable between the second enabling end EN2 of the control element 350 and the external circuit or component, which is equivalent to the second enabling end EN2 of the receiving module 300. The pin GND is a connecting cable between each ground end of the receiving module 300 and the ground. The VDD is a power supply end of the receiving module 300, which is used to connect an external power source. For example, the drain of the third transistor T3 is connected to the pin VDD, and the pin VDD is used to connect the first power source VDD.

Figure 20:
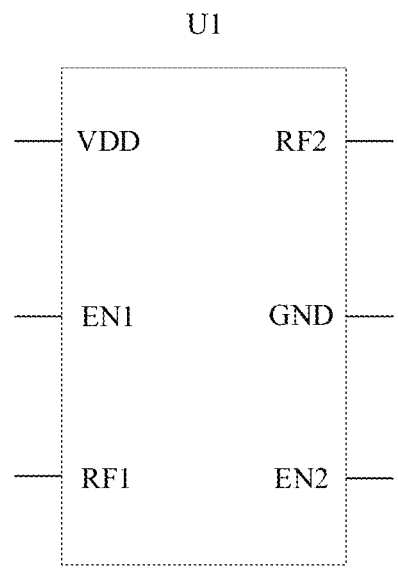
FIG. 20 is a schematic diagram depicting an external pin of a packaging structure according to an embodiment of this application.

FIG. 20 is a schematic diagram depicting an external pin of a packaging structure U1 according to an embodiment of this application. In a possible implementation, the above pins can be implemented in a form of a pad. In another possible implementation, the above pins can also be implemented in a form of a connection point, or the above plurality of pins can be implemented in another form.

According to the packaging structure U1 provided in the foregoing embodiments, an embodiment of this application further provides a printed circuit board (printed circuit board, PCB) using a board-sharing design in which a receiving module with a front filtering unit is provided and a receiving module with a rear filtering unit is provided. The board-sharing design generally means using a same circuit design method to implement different functional circuits, and achieving different functions by using different ways of wiring. The PCB provided in this embodiment of this application can implement the receiving module 300 with a front filtering unit or the receiving module 300 with a rear filtering unit by using different ways of wiring.

In the packaging structure U1 provided in embodiments of this application, the filtering unit 310 and the amplifying unit 330 are integrated in the packaging structure U1, which can reduce a packaging size. A matching inductor required by the amplifying unit 330 is disposed in the packaging structure, which can reduce peripheral circuit components. The operating mode of the amplifying unit 330 can be adjusted by using only the pin EN1 and the pin EN2, thereby adjusting the operating mode of the receiving module 300. This reduces a quantity of pins, further reducing the package size. In addition, the built-in filtering unit 310 of the receiving module 300 can act as both the front filtering unit and the rear filtering unit, which is applicable to different application scenarios.

Figure 21:
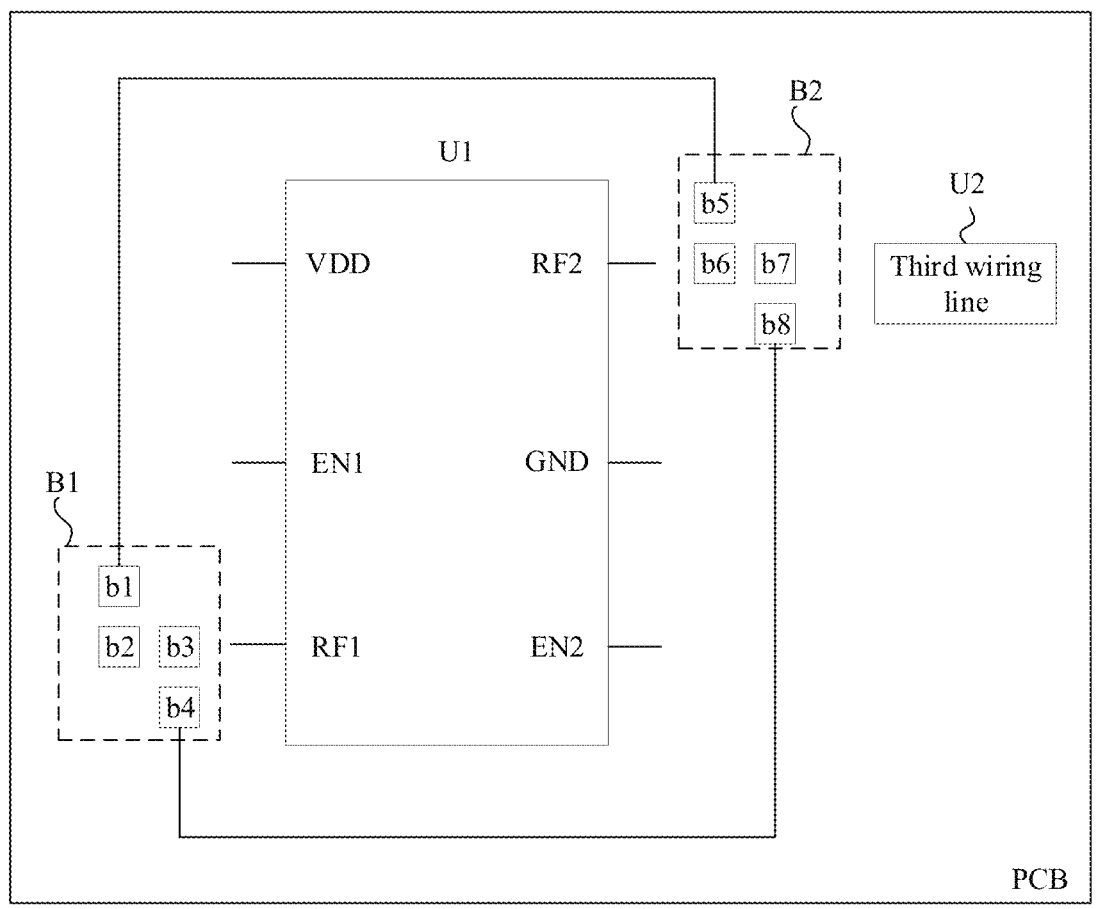
FIG. 21 is a schematic diagram of a printed circuit board according to an embodiment of the application.

Refer to FIG. 21. The PCB provided in this embodiment of this application includes a circuit board, a packaging structure U1 disposed on the circuit board, a first pad group B1 disposed in a first area of the circuit board and a second pad group B2 disposed in a second area of the circuit board.

The first pad group B1 includes a first pad b1, a second pad b2, a third pad b3, and a fourth pad b4, and the second pad group B2 includes a fifth pad b5, a sixth pad b6, a seventh pad b7, and an eighth pad b8. The first pad b1 is connected to the fifth pad b5 by using a first wiring line, and the fourth pad b4 is connected to the eighth pad b8 by using a second wiring line. The seventh pad b7 is configured to connect to a GNSS receiver by using a third wiring line, and the second pad b2 is configured to connect to the antenna by using a fourth wiring line. The third pad b3 is configured to connect to a pin RF1 (that is, the first radio frequency port RF1) of the packaging structure U1 by using a fifth wiring line. The sixth pad b6 is configured to connect to a pin RF2 (that is, the second radio frequency port RF2) of the packaging structure U1 by using a sixth wiring line.

Unless otherwise specified, the first wiring line to the sixth wiring line may be wires, zero-ohm resistors, or conductive materials printed on the circuit board.

During a use process, the pin RF1 of the packaging structure U1 is connected to the third pad b3, and the pin RF2 of the packaging structure U1 is connected to the sixth pad b6. In addition, the operating mode of the receiving module 300 is set so that the amplifying unit 330 operates in the first mode or the second mode. By setting a connection relationship between each pad of the first pad group B1 and each pad of the second pad group B2, the printed circuit board provided in this embodiment of this application can be applied to an electronic device having a cellular communication function or an electronic device having no cellular communication function.

Figure 22:
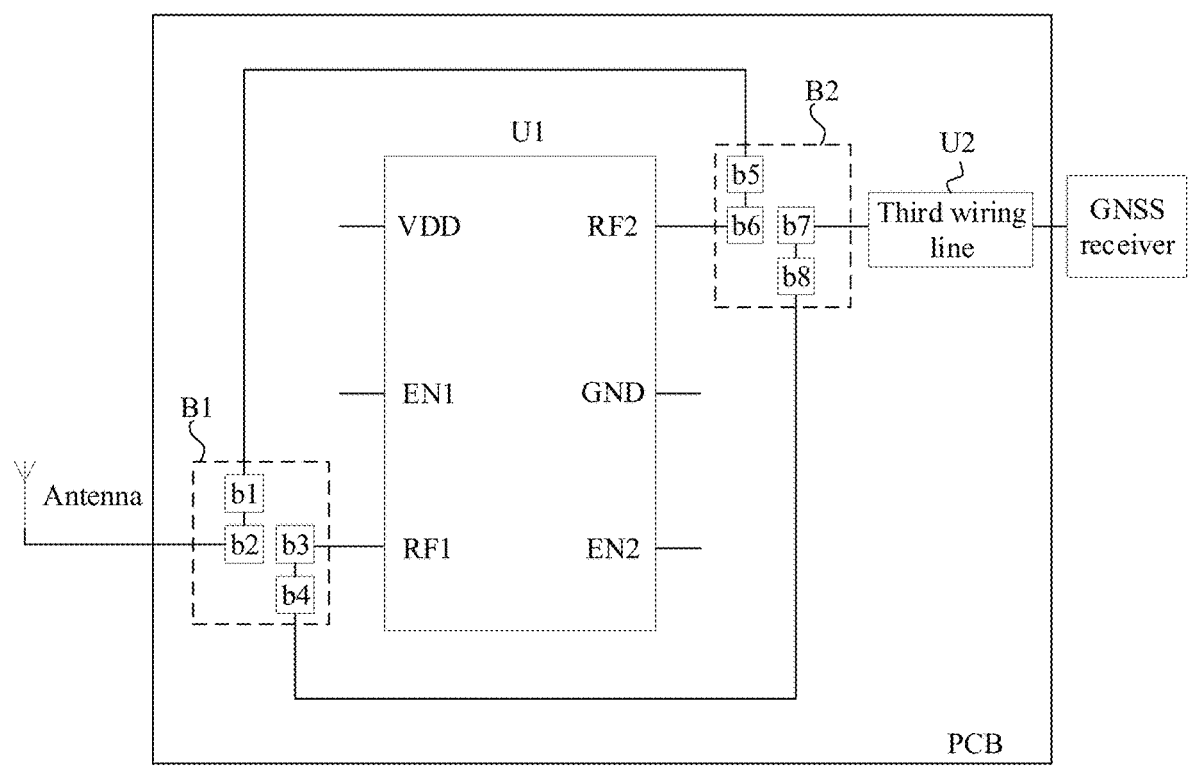
FIG. 22 is a schematic diagram depicting an application scenario of a printed circuit board according to an embodiment of the application.

For example, refer to FIG. 22. When the PCB provided in this embodiment of this application is applied to an electronic device having no cellular communication function, the first filtering unit 310 of the above receiving module 300 may act as a rear filtering unit, that is, the amplifying unit 330 may operate in the second operating mode, with the second radio frequency port RF2 acting as a signal input end and the first radio frequency port RF1 acting as a signal output end.

In this case, the second pad b2 is connected to the antenna by using the fourth wiring line, and the second pad b2 is further electrically connected to the first pad b1. The fifth pad b5 is connected to the sixth pad b6, and the sixth pad b6 is connected to the pin RF2 of the packaging structure U1 by using the sixth wiring line (that is, connected to the second radio frequency port RF2 of the receiving module 300). The third pad b3 is connected to the pin RF1 of the packaging structure U1 by using the fifth wiring line (that is, connected to the first radio frequency port RF1 of the receiving module 300), and the third pad b3 is further electrically connected to the fourth pad b4. The eighth pad b8 is electrically connected to the seventh pad b7, and the seventh pad b7 is configured to connect to the GNSS receiver by using the third wiring line U2.

A signal received by the antenna is transmitted to the second radio frequency port RF2 through the second pad b2, the first pad b1, the fifth pad b5, and the sixth pad b6. After the receiving module 300 processes the signal, the signal is output to the GNSS receiver through the first radio frequency port RF1, the third pad b3, the fourth pad b4, the eighth pad b8, and the seventh pad b7 in sequence.

Figure 23:
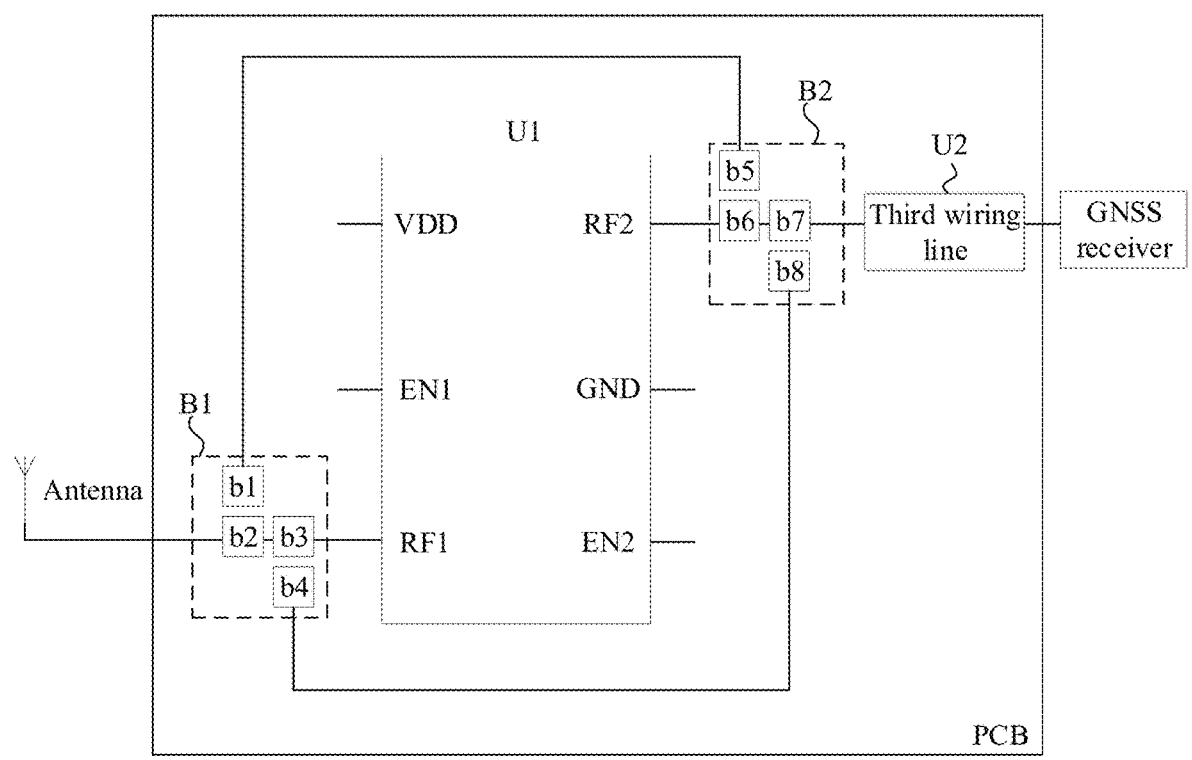
FIG. 23 is a schematic diagram depicting another application scenario of a printed circuit board according to an embodiment of the application.

Refer to FIG. 23. When the PCB provided in embodiments of this application is applied to an electronic device having a cellular communication function, the first filtering unit 310 of the foregoing receiving module 300 may act as a front filtering unit, that is, the amplifying unit 330 may operate in the first operating mode with the first radio frequency port RF1 acting as a signal input end and the second radio frequency port RF2 acting as a signal output end. In this case, a rear filtering unit also needs to be disposed between the amplifying unit 330 and the GNSS receiver.

When the PCB provided in embodiments of this application is applied to an electronic device having a cellular communication function, the second pad b2 is connected to the antenna by using the fourth wiring line, the second pad b2 is further electrically connected to the third pad b3, and the third pad b3 is connected to the pin RF1 of the packaging structure U1 by using the fifth wiring line (that is, connected to the first radio frequency port RF1 of the receiving module 300). The sixth pad b6 is connected to the pin RF2 of the packaging structure U1 by using the sixth wiring line (that is, connected to the second radio frequency port RF2 of the receiving module 300), and the sixth pad b6 is further electrically connected to the seventh pad b7. The seventh pad b7 is configured to connect to the GNSS receiver by using the third wiring line U2.

When the second pad b2 is connected to the antenna, the signal received by the antenna is transmitted to the first radio frequency port RF1 through the second pad b2 and the third pad b3. The first radio frequency port RF1 acts as a signal input end of the receiving module 300. In this case, the amplifying unit 330 operates in the first operating mode, and the first filtering unit 310 disposed in the receiving module 300 acts as a front filtering unit. The signal processed by the receiving module 300 is output to the sixth pad b6 through the second radio frequency port RF2, and the GNSS receiver is connected by using the third wiring line U2 through the seventh pad b7. In this case, a rear filtering unit further needs to be disposed between the second radio frequency port RF2 and the GNSS receiver.

It can be learned from the foregoing that for the PCB provided in embodiments of this application, when the first filtering unit 310 of the receiving module 300 acts as a front filtering unit, the electronic device further needs to be provided with a rear filtering unit. The seventh pad b7 transmits the signal to the rear filtering unit for filtering, and the signal filtered by the rear filtering unit is transmitted to the GNSS receiver. When the first filtering unit 310 of the receiving module 300 acts as the rear filtering unit, the electronic device does not need to be provided with the rear filtering unit.

Figure 24:
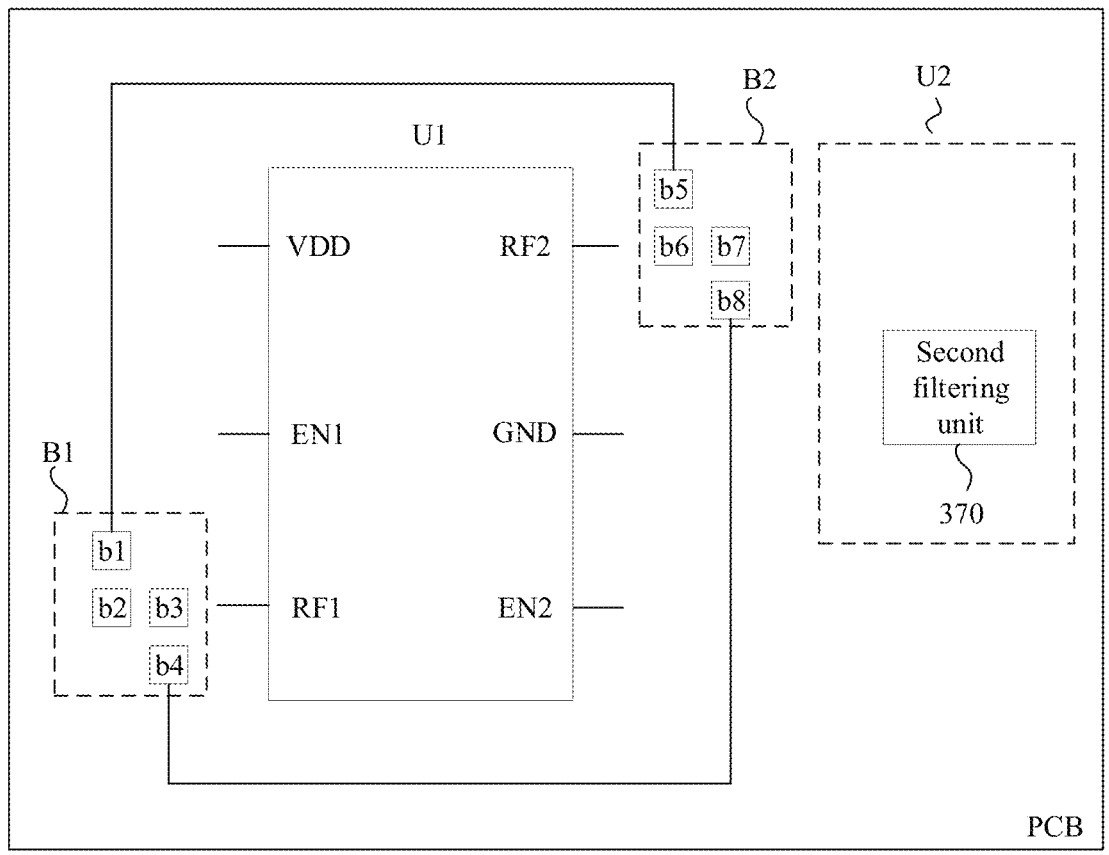
FIG. 24 is a schematic diagram of another printed circuit board according to an embodiment of the application.

For example, refer to FIG. 24 on a base of FIG. 21. In a possible implementation, the third wiring line U2 includes a second filtering unit 370, and the second filtering unit 370 includes a signal input end and a signal output end. The signal input end of the second filtering unit 370 is connected to the seventh pad b7, and the signal output end of the second filtering unit 370 is configured to connect to the GNSS receiver.

Figure 25:
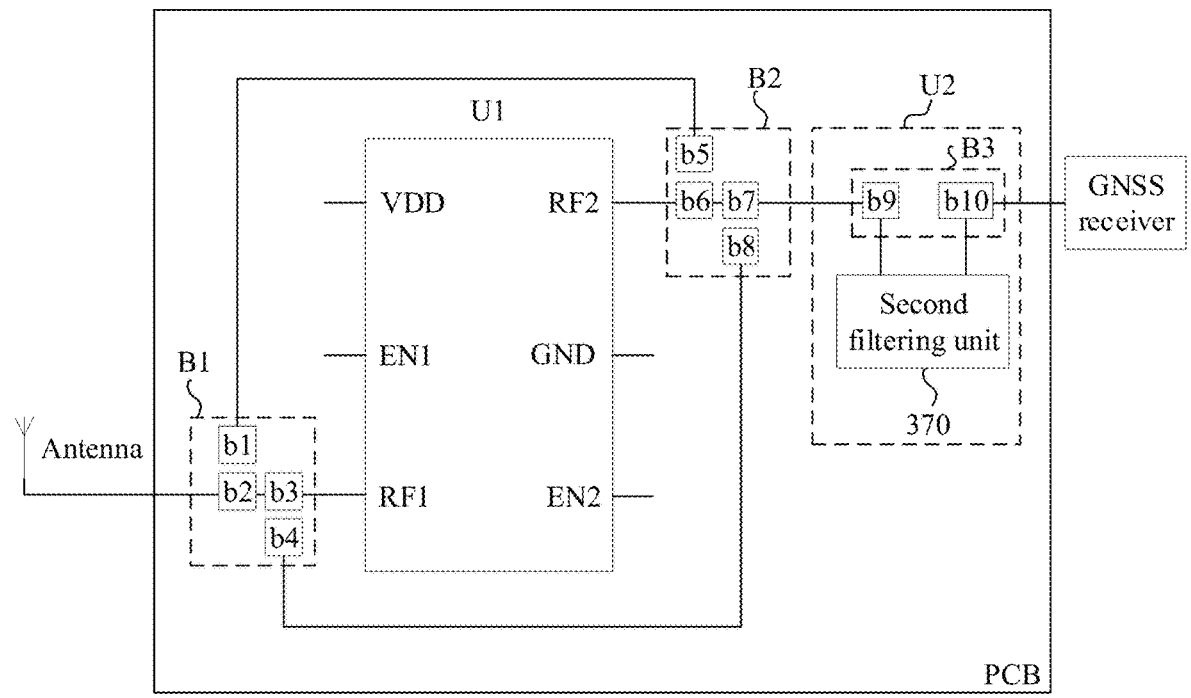
FIG. 25 is a schematic diagram depicting an application scenario of another printed circuit board according to an embodiment of the application.

When the receiving module 300 operates in different operating modes, the electronic device may or may not need to be provided with the second filtering unit 370 that acts as a rear filtering unit. To be applicable to different usage scenarios, refer to FIG. 25 on a base of FIG. 22 and FIG. 24. When the PCB provided in embodiments of this application is applied to an electronic device having a cellular communication function, the second filtering unit 370 needs to be provided as the rear filtering unit. The third wiring line U2 further includes a third pad group B3. The third pad group B3 includes a ninth pad b9 and a tenth pad b10. The ninth pad b9 is electrically connected to the seventh pad b7, and the tenth pad b10 is configured to connect to the GNSS receiver. The ninth pad b9 is further electrically connected to the signal input end of the second filtering unit 370, and the tenth pad b10 is further electrically connected to the signal output end of the second filtering unit 370. When the first filtering unit 310 disposed in the receiving module 300 acts as a front filtering unit, the second filtering unit 370 acts as the rear filtering unit, and the signal output from the pin RF2 (the second radio frequency port RF2) passes through the sixth pad, the seventh pad, and the ninth pad and then is transmitted to the second filtering unit 370. The signal is output to the GNSS receiver from the tenth pad b10 after the second filtering unit 370 filters the signal.

Figure 26:
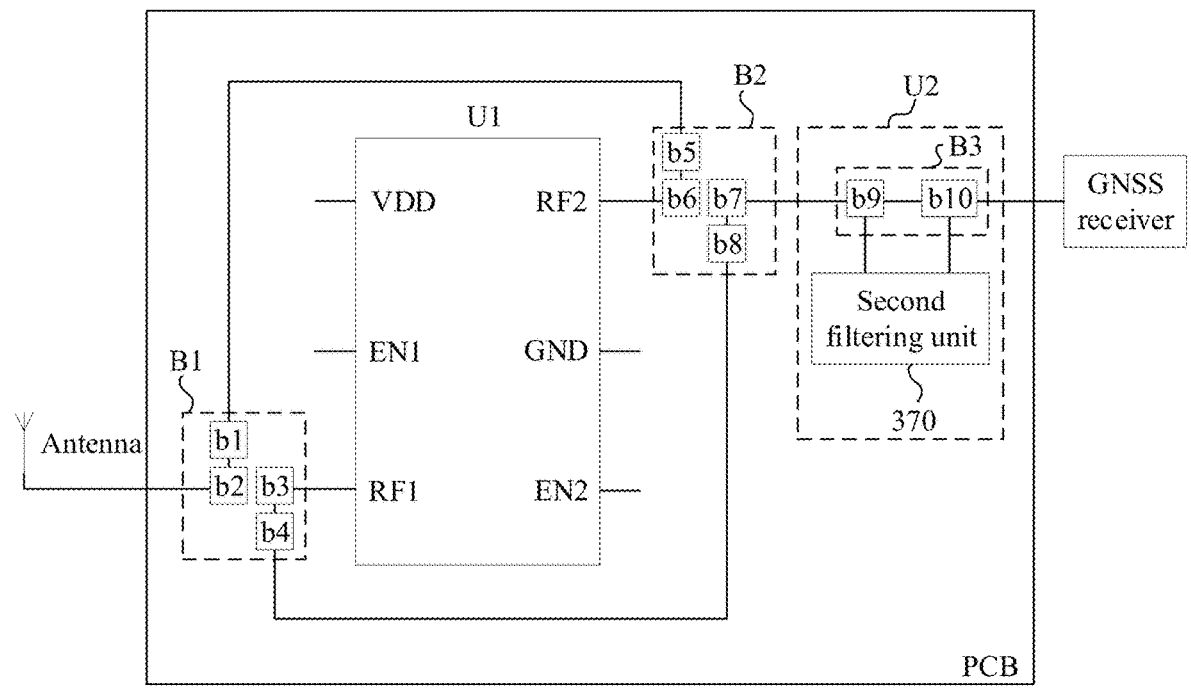
FIG. 26 is a schematic diagram depicting another application scenario of another printed circuit board according to an embodiment of the application.

In another possible implementation, refer to FIG. 26. When the PCB provided in embodiments of this application is applied to an electronic device having a cellular communication function, it is unnecessary that the second filtering unit 370 is provided as a rear filtering unit. In this case, the ninth pad b9 is electrically connected to the tenth pad b10, for example, the second filtering unit 370 can be short-circuited by using zero-ohm resistance welding. The second filtering unit 370 does not affect the signal output from the pin RF1 (first radio frequency port RF1), and the signal processed by the receiving module 300 is directly transmitted to the GNSS receiver.

In this case, the second filtering unit 370 may not be provided in the third wiring line U3. Only when it is applied to an electronic device having a cellular communication function and both a front filtering unit and a rear filtering unit need to be provided, the second filtering unit 370 is provided.

In the foregoing example, the second filtering unit 370 may be a filter that is the same as or different from the first filtering unit 310. This is not limited in embodiments of this application.

Unless otherwise specified, in the PCB provided in embodiments of this application, connection between the pads or between the pads and the pins can be implemented by wiring on the circuit board, such as electrical connection between two pads can be implemented by printing conductive materials, by using connecting wires, or by welding a zero-ohm resistance between the two pads.

According to the PCB provided in the foregoing embodiment, an embodiment of this application further provides an electronic device. The electronic device includes the foregoing PCB, antenna, and GNSS receiver. In a possible implementation, the antenna is disposed at a position with high signal strength on the electronic device, and the GNSS receiver can be disposed on a circuit board of the PCB, and the circuit board is provided with the second pad b2 and the seventh pad b7. The second pad b2 is connected to the antenna by using the fourth wiring line, and the seventh pad is connected to the GNSS receiver by using the third wiring line.

For example, the electronic device provided in embodiments of this application may not have a cellular communication function or communicate without using a cellular communication function. For example, the electronic device may be electronic devices such as a smart bracelet, a tablet computer and the like. When the PCB provided in embodiments of this application is applied to an electronic device having no cellular communication function, the filtering unit 310 disposed in the receiving module 300 can act as a rear filtering unit. Refer to FIG. 22. In this case, the second pad b2 is electrically connected to the first pad b1, the fifth pad b5 is electrically connected to the sixth pad b6, the third pad b3 is electrically connected to the fourth pad b4, and the eighth pad b8 is electrically connected to the seventh pad b7. The second filtering unit 370 may not be provided in the third wiring line U2.

For example, the electronic device provided in embodiments of this application may have a cellular communication function. For example, the electronic device may be a smart phone, a smart watch, or another electronic device having a cellular communication function. When the PCB provided in embodiments of this application is applied to an electronic device having a cellular communication function, the filtering unit 310 disposed in the receiving module 300 can act as a front filtering unit. Refer to FIG. 23. In this case, the second pad b2 is electrically connected to the third pad b3, and the sixth pad b6 is electrically connected to the seventh pad b7. The second filtering unit 370 may be provided in the third wiring line U2. Although this application has been described herein with reference to the embodiments, in a process of practicing this application claimed for protection, a person skilled in the art can understand and implement, by checking the accompanying drawings, the disclosed content, and the following claims, other changes to the disclosed embodiments. In the claims, the term "comprising" (comprising) does not exclude another element or step, and the indefinite article "a" or "an" does not exclude a plurality. One processor or another unit may fulfill several functions listed in the claims. Some measures are recorded in dependent claims different from each other, which, however, does not indicate that these measures cannot be combined to produce good effects.

Although this application has been described with reference to specific features and the embodiments thereof, apparently, various modifications and combinations may be made without departing from the spirit and scope of this application. Correspondingly, the specification and the accompanying drawings are only an example for description of this application defined by the appended claims, and are considered to cover any and all modifications, changes, combinations or equivalents within the scope of this application. Obviously, a person skilled in the art can make various modifications and variations to this application without departing from the spirit and the protection scope of this application. In this way, this application is intended to cover these modifications and variations provided that they fall within the scope of protection defined by the following claims and their equivalent technologies.

What is claimed is:

1. An electronic device, wherein the electronic device comprises a receiving module, and the receiving module comprises a first radio frequency port, a second radio frequency port, a first filtering unit, an amplifying unit, and a control element, and the amplifying unit comprises a first end and a second end;

the first radio frequency port is connected to the first end of the amplifying unit by using the first filtering unit, the second end of the amplifying unit is connected to the second radio frequency port, and the control element is connected to the amplifying unit; and the control element is configured to control an operation mode of the amplifying unit, wherein when the control element controls the amplifying unit to operate in a first mode, the first radio frequency port is configured to receive a first signal, the first filtering unit is configured to filter the first signal received by the first radio frequency port, and the amplifying unit is configured to amplify a resulting filtered signal and output a resulting amplified signal to the second radio frequency port; and when the control element controls the amplifying unit to operate in a second mode, the second radio frequency port is configured to receive a second signal and process the second signal, the amplifying unit is configured to amplify the second signal received by the second radio frequency port, and the first filtering unit is configured to filter a resulting second amplified signal and output a resulting second filtered signal to the first radio frequency port, wherein the amplifying unit comprises a first transistor, a second transistor, a third transistor, a first switch, and a second switch, a gate of the first transistor is connected to the first end of the amplifying unit, a source of the first transistor is grounded, and a drain of the first transistor is connected to a source of the third transistor, a gate of the second transistor is connected to the second end of the amplifying unit, a source of the second transistor is grounded, and a drain of the second transistor is connected to the source of the third transistor, and a drain of the third transistor is connected to a first power supply, the drain of the third transistor is further connected to the second end of the amplifying unit by using the first switch, and the drain of the third transistor is further connected to the first end of the amplifying unit by using the second switch.

2. The electronic device according to claim 1, wherein the control element is configured to control the first transistor and the third transistor to operate in an amplify state, control the second transistor to be cut off, control the first switch to be turned on, and control the second switch to be turned off, so that the amplifying unit operates in the first mode.

3. The electronic device according to claim 1, wherein the control element is configured to control the second transistor and the third transistor to operate in an amplify state, control the first transistor to be cut off, control the second switch to be turned on, and control the first switch to be turned off, so that the amplifying unit operates in the second mode.

4. The electronic device according to claim 1, wherein the control element comprises a first enabling end and a second enabling end;

when the first enabling end is enabled, the control element is configured to control the amplifying unit to operate in the first mode; and when the second enabling end is enabled, the control element is configured to control the amplifying unit to operate in the second mode.

5. The electronic device according to claim 1, wherein the amplifying unit further comprises a first capacitor, and a gate of the third transistor is grounded by using the first capacitor.

6. The electronic device according to claim 1, wherein the receiving module further comprises a first inductor, the first inductor is connected to the first end of the amplifying unit, and a second end of the first inductor is connected to the gate of the first transistor.

7. The electronic device according to claim 1, wherein the receiving module further comprises a second inductor, and the drain of the third transistor is connected to the first power supply by using the second inductor.

8. The electronic device according to claim 1, wherein the first filtering unit comprises a surface acoustic wave filter.

9. The electronic device according to claim 1, wherein the electronic device comprises an antenna, a global navigation satellite system (GNSS) receiver;

the GNSS receiver is connected to the first radio frequency port or the second radio frequency port, and the antenna is connected to the second radio frequency port or the first radio frequency port.

10. A packaging structure, wherein the packaging structure comprises a substrate and a receiving module disposed on the substrate, and the receiving module comprises a first radio frequency port, a second radio frequency port, a first filtering unit, an amplifying unit, and a control element, and the amplifying unit comprises a first end and a second end;

the first radio frequency port is connected to the first end of the amplifying unit by using the first filtering unit, the second end of the amplifying unit is connected to the second radio frequency port, and the control element is connected to the amplifying unit; and the control element is configured to control an operation mode of the amplifying unit, wherein when the control element controls the amplifying unit to operate in a first mode, the first radio frequency port is configured to receive a signal, the first filtering unit is configured to filter the signal received by the first radio frequency port, and the amplifying unit is configured to amplify a resulting filtered signal and output a resulting amplified signal to the second radio frequency port; and when the control element controls the amplifying unit to operate in a second mode, the second radio frequency port is configured to receive a second signal, the amplifying unit is configured to amplify the second signal received by the second radio frequency port, and the first filtering unit is configured to filter a resulting second amplified signal and output a resulting second filtered signal to the first radio frequency port, wherein the control element comprises a first enabling end and a second enabling end, and when the first enabling end is enabled, the control element is configured to control the amplifying unit to operate in the first mode, and when the second enabling end is enabled, the control element is configured to control the amplifying unit to operate in the second mode.

11. An electronic device, wherein the electronic device comprises a printed circuit board, and the printed circuit board comprises a circuit board and a packaging structure disposed on the circuit board, and the packaging structure comprises a substrate and a receiving module disposed on the substrate, and the receiving module comprises a first radio frequency port, a second radio frequency port, a first filtering unit, an amplifying unit, and a control element, and the amplifying unit comprises a first end and a second end;

the first radio frequency port is connected to the first end of the amplifying unit by using the first filtering unit, the second end of the amplifying unit is connected to the second radio frequency port, and the control element is connected to the amplifying unit; and the control element is configured to control an operation mode of the amplifying unit, wherein when the control element controls the amplifying unit to operate in a first mode, the first radio frequency port is configured to receive a signal, the first filtering unit is configured to filter the signal received by the first radio frequency port, and the amplifying unit is configured to amplify a resulting filtered signal and output a resulting amplified signal to the second radio frequency port; and when the control element controls the amplifying unit to operate in a second mode, the second radio frequency port is configured to receive a second signal, the amplifying unit is configured to amplify the second signal received by the second radio frequency port, and the first filtering unit is configured to filter a resulting second amplified signal and output a resulting second filtered signal to the first radio frequency port, wherein the printed circuit board further comprises a first pad group disposed in a first area of the circuit board and a second pad group disposed in a second area of the circuit board, wherein the first pad group comprises a first pad, a second pad, a third pad, and a fourth pad, and the second pad group comprises a fifth pad, a sixth pad, a seventh pad, and an eighth pad;

the first pad is connected to the fifth pad by using a first wiring line, and the fourth pad is connected to the eighth pad by using a second wiring line;

the seventh pad is configured to connect to a global navigation satellite system (GNSS) receiver by using a third wiring line, and the second pad is configured to connect to an antenna by using a fourth wiring line; and the third pad is configured to connect to the first radio frequency port by using a fifth wiring line, and the sixth pad is configured to connect to the second radio frequency port by using a sixth wiring line.

12. The electronic device according to claim 11, wherein the second pad is electrically connected to the third pad, and the sixth pad is electrically connected to the seventh pad.

13. The electronic device according to claim 12, wherein the electronic device having a cellular communication function, and the electronic device comprises the antenna and the GNSS receiver; and the second pad is connected to the antenna by using the fourth wiring line, and the seventh pad is electrically connected to the GNSS receiver by using the third wiring line.

14. The electronic device according to claim 11, wherein the second pad is electrically connected to the first pad, and the fifth pad is electrically connected to the sixth pad; and the seventh pad is electrically connected to the eighth pad, and the fourth pad is electrically connected to the third pad.

15. The electronic device according to claim 14, wherein the electronic device having no cellular communication function; and the electronic device comprises the antenna and the GNSS receiver; and the second pad is connected to the antenna by using the fourth wiring line, and the seventh pad is electrically connected to the GNSS receiver by using the third wiring line.

16. The electronic device according to claim 11, wherein the third wiring line comprises a second filtering unit.

17. The electronic device according to claim 16, wherein the third wiring line further comprises a third pad group disposed in a third area of the circuit board, the third pad group comprises a ninth pad and a tenth pad, the ninth pad is electrically connected to the seventh pad, and the tenth pad is configured to connect to the GNSS receiver; and the second filtering unit comprises a signal input end and a signal output end, the ninth pad is further electrically connected to the signal input end of the second filtering unit, and the tenth pad is further connected to the signal output end of the second filtering unit; or the ninth pad is electrically connected to the tenth pad.

* * * * *